US012706045B2

(12) United States Patent
Moon et al.

(10) Patent No.: US 12,706,045 B2
(45) Date of Patent: Aug. 11, 2026

(54) DISPLAY DEVICE AND ELECTRONIC DEVICE INCLUDING THE SAME

(71) Applicant: Samsung Display Co., LTD., Yongin-si (KR)

(72) Inventors: Geumju Moon, Yongin-si (KR); Nackhyeon Keum, Yongin-si (KR); Sungmin Son, Yongin-si (KR); Wonjun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/080,256

(22) Filed: Mar. 14, 2025

(65) Prior Publication Data

US 2025/0391358 A1 Dec. 25, 2025

(30) Foreign Application Priority Data

Jun. 20, 2024 (KR) ........................ 10-2024-0080545

(51) Int. Cl.
*G09G 3/3233* (2016.01)
*H10K 59/121* (2023.01)
*H10K 59/131* (2023.01)
*G09G 3/32* (2016.01)

(52) U.S. Cl.
CPC ....... *G09G 3/3233* (2013.01); *H10K 59/1213* (2023.02); *H10K 59/131* (2023.02); *G09G 3/32* (2013.01); *G09G 2300/0426* (2013.01); *G09G 2300/0819* (2013.01); *G09G 2300/0852* (2013.01); *G09G 2300/0861* (2013.01); *G09G 2310/08* (2013.01); *G09G 2320/0233* (2013.01)

(58) Field of Classification Search
None
See application file for complete search history.

(56) References Cited

U.S. PATENT DOCUMENTS 10,147,778 B2 * 12/2018 Sato ........................ H10D 99/00
11,545,076 B2 * 1/2023 Aoki ........................ G09G 3/32
2023/0237965 A1 7/2023 Lin et al.
2025/0096216 A1 * 3/2025 Aoki ..................... H10W 90/00

FOREIGN PATENT DOCUMENTS

KR 10-2022-0030416 3/2022
KR 10-2023-0111692 7/2023

* cited by examiner

*Primary Examiner* — Aneeta Yodichkas
(74) *Attorney, Agent, or Firm* — Womble Bond Dickinson (US) LLP

(57) ABSTRACT

A display device includes: a pixel circuit and a light emitting element electrically connected to the pixel circuit, a gate driver outputting a gate signal, and a data driver outputting a data voltage. The pixel circuit includes a driving transistor including a first end of a first area, a second area electrically connected to a power voltage line configured to receive a driving voltage, a first channel area, and a portion of a first gate electrode overlapping the first channel area, a first switching transistor including a portion of a first upper active pattern on the first gate electrode and configured to receive an initialization voltage, and a portion of a first upper gate line configured to receive a first gate signal and overlapping the first upper active pattern, and a connection pattern on the first upper gate line and connecting the first upper active pattern and the first area.

15 Claims, 23 Drawing Sheets

DISPLAY DEVICE AND ELECTRONIC DEVICE INCLUDING THE SAME

CROSS-REFERENCE TO RELATED APPLICATION

The present application claims priority to and the benefit of Korean Patent Application No. 10-2024-0080545, filed on Jun. 20, 2024, in the Korean Intellectual Property Office, the entire disclosure of which is incorporated herein by reference.

BACKGROUND

1. Field

Aspects of some embodiments include a display device.

2. Description of the Related Art

As information technology develops, the importance of display devices, which are communication media between users and information, is being highlighted. Accordingly, the use of display devices such as a liquid crystal display device, an organic light emitting display device, a plasma display device, and the like is increasing.

The above information disclosed in this Background section is only for enhancement of understanding of the background and therefore the information discussed in this Background section does not necessarily constitute prior art.

SUMMARY

Aspects of some embodiments include a display device. For example, aspects of some embodiments relate to a display device which provides visual information.

Aspects of some embodiments include a display device which that may be capable of reducing a back voltage corresponding to black gradation.

A display device according to some embodiments of the present disclosure includes a pixel including: a pixel circuit and a light emitting element electrically connected to the pixel circuit and including an anode electrode and a cathode electrode, a gate driver which outputs a gate signal to the pixel, and a data driver which outputs a data voltage to the pixel. According to some embodiments, the pixel circuit includes a driving transistor including a first end of a first area, a second area electrically connected to a power voltage line to which a driving voltage is applied, a first channel area located between the first area and the second area, and a portion of a first gate electrode overlapping the first channel area in a plan view, a first switching transistor including a portion of a first upper active pattern on the first gate electrode and to which an initialization voltage is applied, and a portion of a first upper gate line to which a first gate signal is applied and overlapping the first upper active pattern in the plan view, and a connection pattern on the first upper gate line and connecting the first upper active pattern and the first area through a contact hole.

According to some embodiments, during one frame, an operation section of the pixel may include a first initialization section in which a first initialization operation is performed, a second initialization section in which a second initialization operation is performed after the first initialization operation, and a light emitting operation section in which a light emitting operation is performed after the second initialization operation.

According to some embodiments, the first initialization operation and the second initialization operation may be controlled by the same first gate signal.

According to some embodiments, during one frame, the first gate signal may have an activation level in the first initialization section and an activation level in the second initialization section.

According to some embodiments, the second initialization section may be closer to a light emitting section than the first initialization section.

According to some embodiments, the first switching transistor may further include a portion of a first middle gate line to which the first gate signal is applied, under the first upper gate line, and overlapping the first upper active pattern.

According to some embodiments, the pixel circuit may further include a second switching transistor including a second upper active pattern in a same layer as the first upper active pattern and a portion of a second upper gate line to which a second gate signal different from the first gate signal is applied and overlapping the second upper active pattern.

According to some embodiments, when the first switching transistor is turned on and the second switching transistor is turned on in the first initialization section, the initialization voltage may be applied to the gate electrode of the driving transistor. When the first switching transistor is turned on in the second initialization section, the initialization voltage may be applied to the first area of the driving transistor.

According to some embodiments, the second switching transistor may further include a portion of a second middle gate line to which the second gate signal is applied, located under the second upper gate line, and overlapping the second upper active pattern.

According to some embodiments, the driving transistor may include a silicon semiconductor, and the first and second switching transistors may include a metal oxide semiconductor.

According to some embodiments, the pixel circuit may further include a third switching transistor including a second end of the first area, a third area electrically connected to the anode electrode, a second channel area located between the first area and the third area, and a portion of a second gate electrode overlapping the second channel area in the plan view.

According to some embodiments, the first upper active pattern may include an extension portion extending in a first direction and a connection portion protruding from the extension portion in a second direction intersecting the first direction, and the first upper gate line may partially overlap the connection portion in the plan view.

According to some embodiments, the connection pattern may be connected to the connection portion through a first contact hole and to the first area through a second contact hole.

According to some embodiments, the power voltage line may be on the connection pattern.

A display device according to some embodiments of the present disclosure includes a light emitting element including an anode electrode and a cathode electrode, a driving transistor including a first end of a first area, a second area electrically connected to a power voltage line to which a driving voltage is applied, a first channel area located between the first area and the second area, and a portion of a first gate electrode overlapping the first channel area in a plan view, a first switching transistor including a portion of a first upper active pattern on the first gate electrode and to which an initialization voltage is applied, and a portion of a first upper gate line to which a first gate signal is applied and overlapping the first upper active pattern in the plan view, and a connection pattern on the first upper gate line and connecting the first upper active pattern and the first area through a contact hole.

According to some embodiments, the display device may further include a second switching transistor including a second upper active pattern in a same layer as the first upper active pattern and a portion of a second upper gate line to which a second gate signal different from the first gate signal is applied and overlapping the second upper active pattern.

According to some embodiments, the driving transistor may include a silicon semiconductor, and the first and second switching transistors may include a metal oxide semiconductor.

According to some embodiments, the display device may further include a third switching transistor including a second end of the first area, a third area electrically connected to the anode electrode, a second channel area located between the first area and the third area, and a portion of a second gate electrode overlapping the second channel area in the plan view.

According to some embodiments, the first upper active pattern may include an extension portion extending in a first direction and a connection portion protruding from the extension portion in a second direction intersecting the first direction, and the first upper gate line may partially overlap the connection portion in the plan view.

According to some embodiments, the connection pattern may be connected to the connection portion through a first contact hole and to the first area through a second contact hole.

An electronic device according to some embodiments of the present disclosure includes a display device and a processor configured to the display device with an image data signal and an input control signal to control the display device. According to some embodiments, the display device includes a pixel including: a pixel circuit and a light emitting element electrically connected to the pixel circuit and including an anode electrode and a cathode electrode, a gate driver configured to output a gate signal to the pixel, and a data driver configured to output a data voltage to the pixel. According to some embodiments, the pixel circuit includes a driving transistor including a first end of a first area, a second area electrically connected to a power voltage line configured to receive a driving voltage, a first channel area between the first area and the second area, and a portion of a first gate electrode overlapping the first channel area in a plan view, a first switching transistor including a portion of a first upper active pattern on the first gate electrode and configured to receive an initialization voltage, and a portion of a first upper gate line configured to receive a first gate signal and overlapping the first upper active pattern in the plan view, and a connection pattern on the first upper gate line and connecting the first upper active pattern and the first area through a contact hole.

In each pixel circuit of the display device according to some embodiments of the present disclosure, a portion of a second upper active pattern (e.g., a drain electrode) of a fourth transistor may be connected to a first area (e.g., drain electrode) of a first transistor through a second connection pattern. In this case, for one frame, each pixel may perform a first initialization operation in which a first gate electrode of the first transistor is initialized, and a second initialization operation in which the first area of the first transistor is initialized after the first initialization operation and immediately before the pixel emits light.

That is, a charge accumulated in the first area of the first transistor may be bypassed by a bias voltage right immediately before the pixel emits light. Accordingly, the black voltage corresponding to the black gradation may be relatively reduced. In addition, bright spot defects in the image due to current leakage of the fourth transistor may be prevented or reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
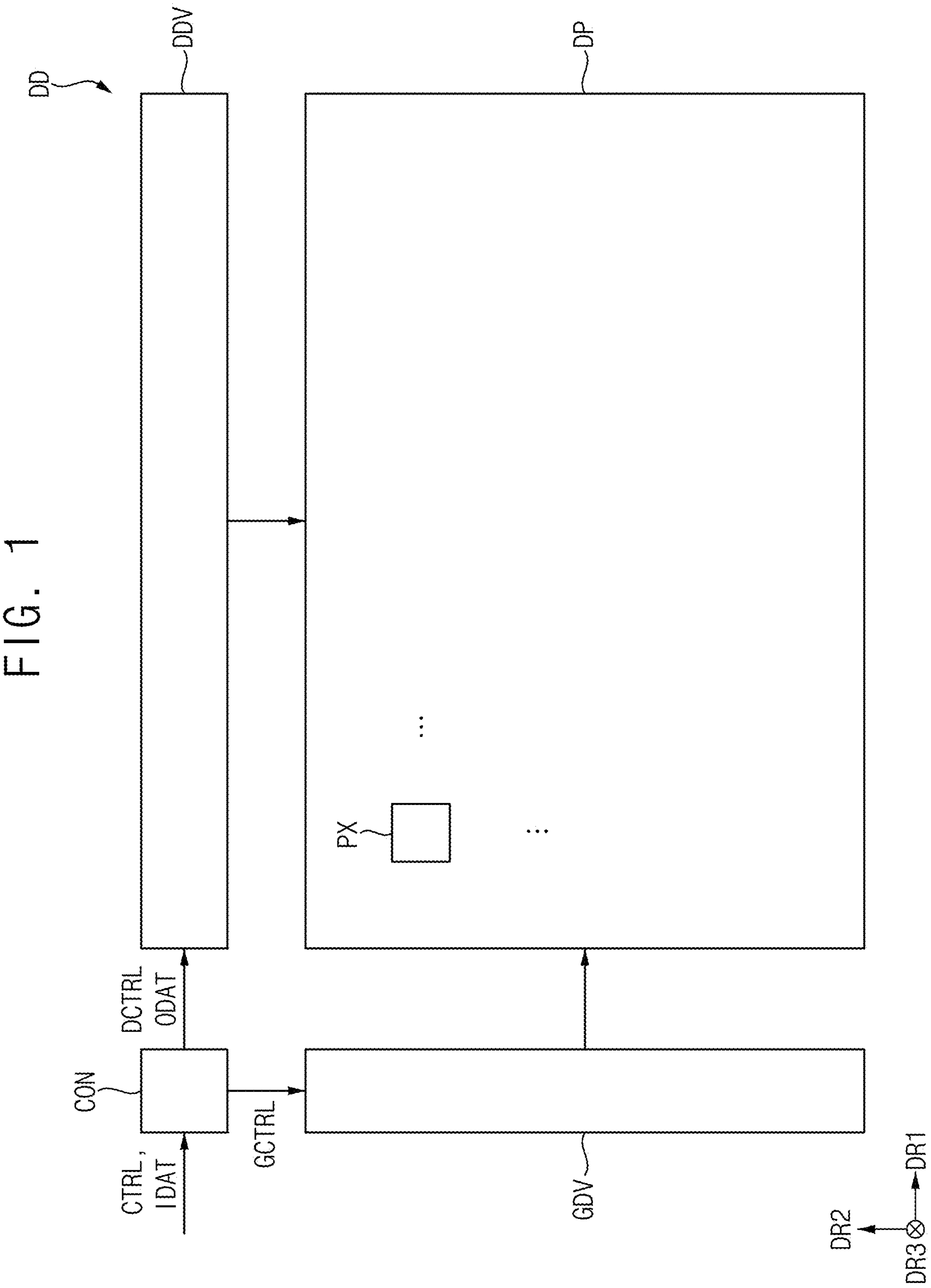
FIG. 1 is a block diagram showing a display device according to some embodiments of the present disclosure.

Hereinafter, a display device according to some embodiments of the present disclosure will be explained in detail with reference to the accompanying drawings. The same reference numerals are used for the same components in the drawings, and redundant descriptions of the same components will be omitted.

FIG. 1 is a block diagram showing a display device according to some embodiments of the present disclosure.

Referring to FIG. 1, a display device DD according to some embodiments of the present disclosure may include a display panel DP, a data driver DDV, a gate driver GDV, and a timing controller CON.

The display device DD may display images through the display panel DP. For example, the display panel DP may include a plurality of pixels PX, each of the pixels PX including a driving transistor and a light emitting element electrically connected to the driving transistor. The light emitting element may emit light by receiving a driving current from the driving transistor. In this way, the display device DD may display images by the plurality of pixels PX emitting light.

One pixel PX may display one basic color (e.g., one set or predetermined basic color). In other words, one pixel PX may be the minimum unit capable of displaying a color independent of other pixels PX. For example, one pixel PX may display any one color among red, green, and blue.

The pixels PX may be arranged in a matrix form along a first direction DR1 and a second direction DR2 intersecting the first direction DR1. For example, the first direction DR1 and the second direction DR2 may be perpendicular.

The timing controller CON may generate a gate control signal GCTRL, a data control signal DCTRL, and output image data ODAT based on a control signal CTRL and an input image data IDAT provided from the outside. For example, the control signal CTRL may include a vertical synchronization signal, a horizontal synchronization signal, an input data enable signal, a master clock signal, and the like. For example, the input image data IDAT may be RGB data including red image data, green image data, and blue image data. Alternatively, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal, a clock signal, and the like. For example, the gate driver GDV may be manufactured as a separate panel and connected to the display panel DP. The gate driver GDV may be electrically connected to the display panel DP and may sequentially output the gate signals. Each of the plurality of pixels PX may receive data voltages from the data driver DDV according to the control of each of the gate signals.

The data driver DDV may generate the data voltages based on the data control signal DCTRL and the output image data ODAT provided from the timing controller CON. For example, the data control signal DCTRL may include an output data enable signal, a horizontal start signal, a load signal, and the like. For example, the data driver DDV may be manufactured as a separate panel and electrically connected to the display panel DP. Each of the plurality of pixels PX may transmit a signal for luminance corresponding to each of the data voltages to the light emitting element.

Figure 2:
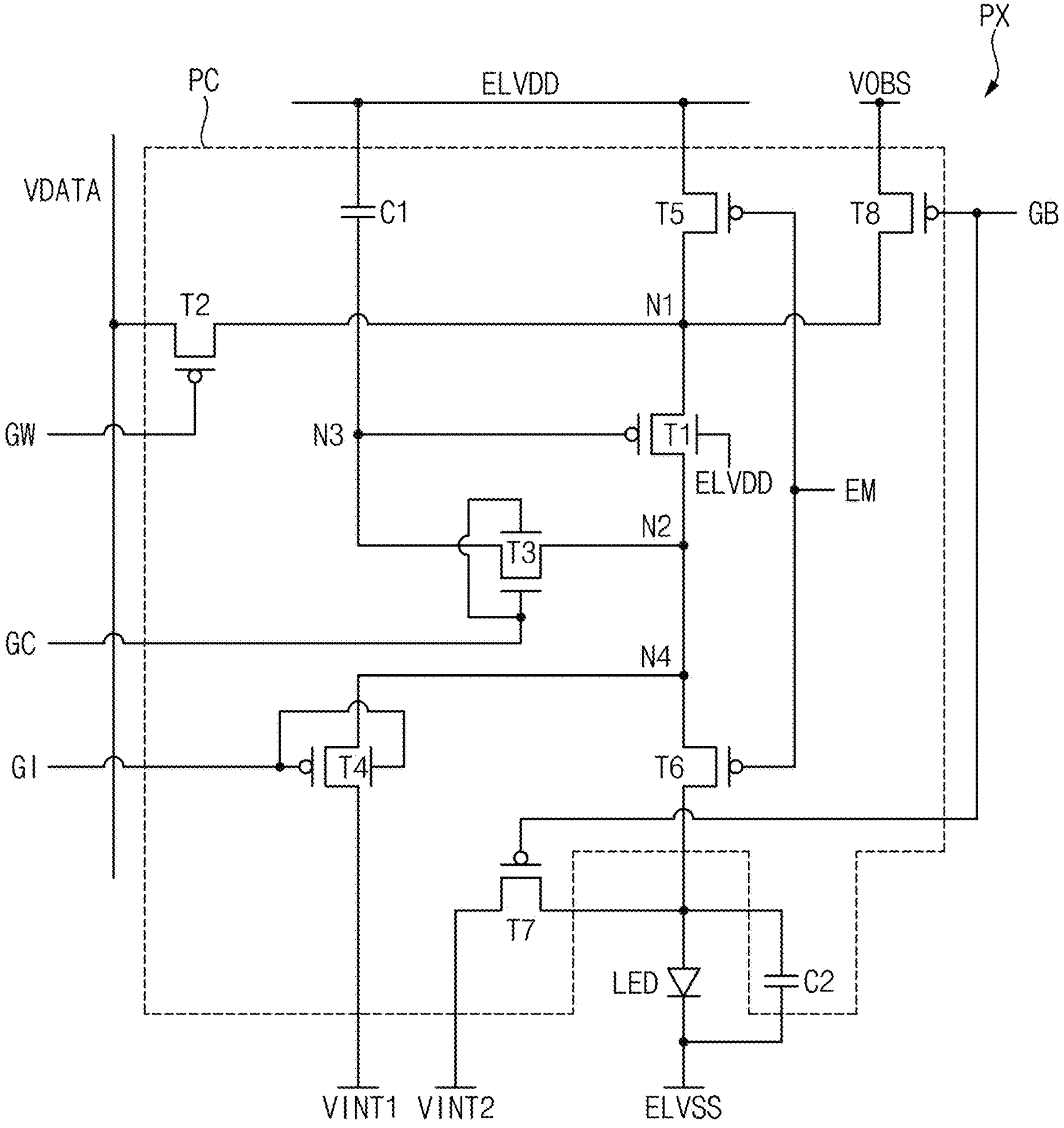
FIG. 2 is a circuit diagram illustrating an example of a pixel included in a display panel of FIG. 1.

FIG. 2 is a circuit diagram illustrating an example of a pixel included in a display panel of FIG. 1. Although FIG. 2 illustrates various components in pixel according to some embodiments, embodiments according to the present disclosure are not limited thereto, and according to various embodiments, the pixel may include additional components or fewer components without departing from the spirit and scope of embodiments according to the present disclosure.

Referring to FIG. 2, each pixel PX may include a pixel circuit PC and a light emitting element LED electrically connected to the pixel circuit PC. Here, the pixel circuit PC may include first, second, third, fourth, fifth, sixth, seventh, and eighth transistors T1, T2, T3, T4, T5, T6, T7, and T8, a first capacitor C1, and a second capacitor C2. there is. The pixel circuit PC may generate a driving current, and the light emitting element LED may emit light based on the driving current.

The first transistor T1 may include a first electrode, a second electrode, a gate electrode, and a back gate electrode. The gate electrode of the first transistor T1 may be connected to a third node N3. The first power voltage ELVDD may be applied to the back gate electrode of the first transistor T1. The first electrode of the first transistor T1 may be connected to a first node N1. The second electrode of the first transistor T1 may be connected to a second node N2. The first transistor T1 may be referred to as a driving transistor.

The first transistor T1 may generate the driving current based on the difference between a data voltage VDATA and a driving voltage ELVDD. The first transistor T1 may provide the driving current to the light emitting element LED.

The second transistor T2 may include a first electrode, a second electrode, and a gate electrode. A first gate signal GW may be applied to the gate electrode of the second transistor T2. The data voltage VDATA may be applied to the first electrode of the second transistor T2. The second electrode of the second transistor T2 may be connected to the first node N1. The first gate signal GW may be referred to as a data write signal.

When the second transistor T2 is turned on in response to the first gate signal GW, the second transistor T2 may provide the data voltage VDATA to the first node N1. Conversely, when the second transistor T2 is turned off in response to the first gate signal GW, the second transistor T2 may block the supply of the data voltage VDATA.

The third transistor T3 may include a first electrode, a second electrode, a gate electrode, and a back gate electrode. A second gate signal GC may be applied to the gate electrode of the third transistor T3. The back gate electrode of the third transistor T3 may be connected to the gate electrode of the third transistor T3. Accordingly, the second gate signal GC may also be applied to the back gate electrode of the third transistor T3. The first electrode of the third transistor T3 may be connected to the second node N2. The second electrode of the third transistor T3 may be connected to the third node N3.

When the third transistor T3 is turned on in response to the second gate signal GC, the third transistor T3 may compensate for the threshold voltage of the first transistor T1 by diode-connecting the first transistor T1. The second gate signal GC may be referred to as a compensation gate signal.

The fourth transistor T4 may include a first electrode, a second electrode, a gate electrode, and a back gate electrode. The third gate signal GI may be applied to the gate electrode of the fourth transistor T4. The back gate electrode of the fourth transistor T4 may be connected to the gate electrode of the fourth transistor T4. Accordingly, the third gate signal GI may also be applied to the back gate electrode of the fourth transistor T4. A first initialization voltage VINT1 may be applied to the first electrode of the fourth transistor T4. The second electrode of the fourth transistor T4 may be connected to a fourth node N4, which is connected to the second node N2. The third gate signal GI may be referred to as a data initialization gate signal.

According to some embodiments, when the third transistor T3 is turned on in response to the second gate signal GC and the fourth transistor T4 is turned on in response to the third gate signal GI, the fourth transistor T4 may provide the first initialization voltage VINT1 to the gate electrode of the first transistor T1. In this case, the fourth transistor T4 may initialize the gate electrode of the first transistor T1 to the first initialization voltage VINT1. Conversely, when the third transistor T3 is turned off in response to the second gate signal GC and the fourth transistor T4 is turned off in response to the third gate signal GI, the fourth transistor T4 may block the supply of the first initialization voltage VINT1.

In addition, when the third transistor T3 is turned off in response to the second gate signal GC and the fourth transistor T4 is turned on in response to the third gate signal GI, the fourth transistor T4 may block the supply of the first initialization voltage VINT1. According to some embodiments, the third transistor T3 is turned off in response to the second gate signal GC, the fourth transistor T4 is turned on immediately before the fifth and sixth transistors T5 and T6 are turned on, the fourth transistor T4 may provide the first initialization voltage VINT1 to the second electrode of the first transistor T1. In this case, the fourth transistor T4 may initialize the second electrode of the first transistor T1.

The fifth transistor T5 may include a first electrode, a second electrode, and a gate electrode. A light emitting control signal EM may be applied to the gate electrode of the fifth transistor T5. The first power voltage ELVDD may be applied to the first electrode of the fifth transistor T5. The second electrode of the fifth transistor T5 may be connected to the first node N1.

The sixth transistor T6 may include a first electrode, a second electrode, and a gate electrode. The light emitting control signal EM may be applied to the gate electrode of the sixth transistor T6. The first electrode of the sixth transistor T6 may be connected to the fourth node N4. The second electrode of the sixth transistor T6 may be connected to the anode electrode of the light emitting element LED.

When the fifth transistor T5 and the sixth transistor T6 are turned on in response to the light emitting control signal EM, the fifth transistor T5 and the sixth transistor T6 may provide the driving current generated by the first transistor T1 to the anode electrode of the light emitting element LED. Conversely, when the fifth transistor T5 and the sixth transistor T6 are turned off in response to the light emitting control signal EM, the fifth transistor T5 and the sixth transistor T6 may block the supply of the driving current generated by the first transistor T1.

The seventh transistor T7 may include a first electrode, a second electrode, and a gate electrode. A fourth gate signal GB may be applied to the gate electrode of the seventh transistor T7. A second initialization voltage VINT2 may be applied to the first electrode of the seventh transistor T7. The second electrode of the seventh transistor T7 may be connected to the anode electrode of the light emitting element LED. The fourth gate signal GB may be referred to as an initialization gate signal.

When the seventh transistor T7 is turned on in response to the fourth gate signal GB, the seventh transistor T7 may provide the second initialization voltage VINT2 to the anode electrode of the light emitting element LED. In this case, the seventh transistor T7 may initialize the anode electrode of the light emitting element LED with the second initialization voltage VINT2. Conversely, when the seventh transistor T7 is turned off in response to the fourth gate signal GB, the seventh transistor T7 may block the supply of the second initialization voltage VINT2.

The eighth transistor T8 may include a first electrode, a second electrode, and a gate electrode. The fourth gate signal GB may be applied to the gate electrode of the eighth transistor T8. A bias voltage VOBS may be applied to the first electrode of the eighth transistor T8. The second electrode of the eighth transistor T8 may be connected to the first node N1.

When the eighth transistor T8 is turned on in response to the fourth gate signal GB, the eighth transistor T8 may provide the bias voltage VOBS to the first node N1. Conversely, when the eighth transistor T8 is turned off in response to the fourth gate signal GB, the eighth transistor T8 may block the supply of the bias voltage VOBS.

The first capacitor C1 may include a first electrode and a second electrode. The first power voltage ELVDD may be applied to the first electrode of the first capacitor C1. The second electrode of the first capacitor C1 may be connected to the third node N3.

The light emitting element LED may include an anode electrode and a cathode electrode. The anode electrode of the light emitting element LED may be connected to the second electrode of the seventh transistor T7. A second power voltage ELVSS may be applied to the cathode electrode of the light emitting element LED. The voltage level of the second power voltage ELVSS may be lower than the voltage level of the first power voltage ELVDD. The light emitting element LED may emit light based on the driving current.

The second capacitor C2 may include a first electrode and a second electrode. The first electrode of the second capacitor C2 may be connected to the anode electrode of the light emitting element LED, and the second electrode of the second capacitor C2 may be connected to the cathode electrode of the light emitting element LED. Alternatively, the second capacitor C2 may not be formed.

Each of the second, third, fourth, fifth, sixth, seventh, and eighth transistors T2, T3, T4, T5, T6, T7, and T8 may be referred to as a switching transistor.

According to some embodiments, each of the first transistor T1, the second transistor T2, the fifth transistor T5, the sixth transistor T6, the seventh transistor T7, and the eighth transistor T8 may include a silicon semiconductor (e.g., polysilicon), and each of the third transistor T3 and fourth transistor T4 may include a metal oxide semiconductor (e.g., IGZO). However, embodiments of the present disclosure are not necessarily limited thereto.

According to some embodiments, the each of the first transistor T1, the second transistor T2, the fifth transistor T5, the sixth transistor T6, the seventh transistor T7, and the eighth transistor T8 may be a PMOS transistor, and each of the third transistor T3 and fourth transistor T4 may be an NMOS transistor. However, the embodiments of the present disclosure are not necessarily limited thereto. For example, the first, second, third, fourth, fifth, sixth, seventh, and eighth transistors T1, T2, T3, T4, T5, T6, T7, and T8 may be all PMOS transistors or all NMOS transistors.

The first power voltage ELVDD may be referred to as a driving voltage, and the second power voltage ELVSS may be referred to as a common voltage.

In FIG. 2, each pixel PX is described as including eight transistors and two capacitors, but embodiments of the present disclosure are not necessarily limited thereto.

Figure 3:
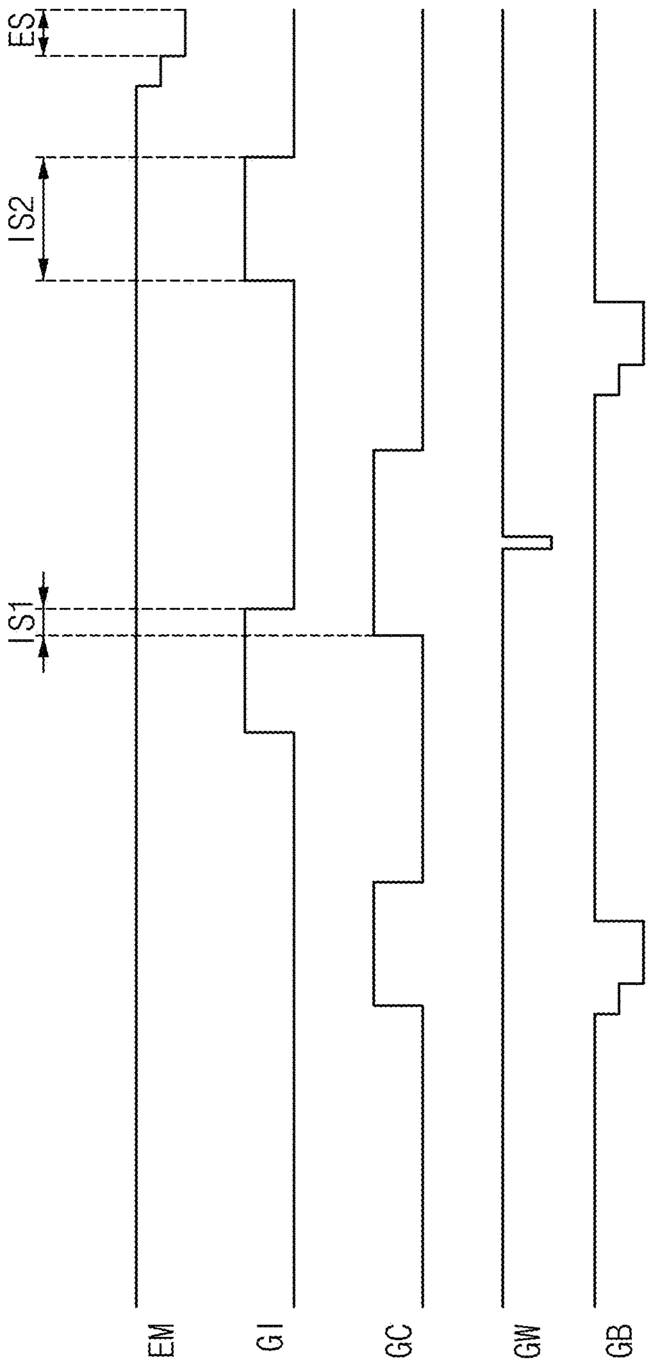
FIG. 3 is a timing diagram for explaining an operation of the pixel of FIG. 2.

FIG. 3 is a timing diagram for explaining an operation of the pixel of FIG. 2.

Referring to FIGS. 2 and 3, the first gate signal GW, the second gate signal GC, the third gate signal GI, the fourth gate signal GB, and the light emitting control signal EM may be applied at different timings.

Hereinafter, each of the first transistor T1, the second transistor T2, the fifth transistor T5, the sixth transistor T6, the seventh transistor T7, and the eighth transistor T8 will be described as a PMOS transistor, and each of the third transistor T3 and the fourth transistor T4 will be described as a NMOS transistor.

When the first gate signal GW has a low level, the first transistor T1 may be turned on in response to the first gate signal GW. When the first gate signal GW has a high level, the first transistor T1 may be turned off in response to the first gate signal GW.

When the second gate signal GC has a high level, the third transistor T3 may be turned on in response to the second gate signal GC. When the second gate signal GC has a low level, the third transistor T3 may be turned off in response to the second gate signal GC.

When the third gate signal GI has a high level, the fourth transistor T4 may be turned on in response to the third gate signal GI. When the third gate signal GI has a low level, the fourth transistor T4 may be turned off in response to the third gate signal GI.

When the fourth gate signal GB has a low level, the seventh and eighth transistors T7 and T8 may be turned on in response to the fourth gate signal GB. When the fourth gate signal GB has a high level, the seventh and eighth transistors T7 and T8 may be turned off in response to the fourth gate signal GB.

When the light emitting control signal EM has a low level, the fifth and sixth transistors T5 and T6 may be turned on in response to the emission control signal EM. When the light emitting control signal EM has a high level, the fifth and sixth transistors T5 and T6 may be turned off in response to the emission control signal EM.

According to some embodiments, an operation section of each pixel PX may include a first initialization section IS1 in which a first initialization operation is performed and a second initialization section IS2 in which a second initialization operation is performed. Each pixel PX may sequentially perform the first initialization operation and the second initialization operation during one frame. As each pixel PX sequentially performs the first initialization operation and the second initialization operation during one frame, the operation section of each pixel PX may also include the first initialization section IS1 and the second initialization section IS2 sequentially. In the operation section of each pixel PX, descriptions of the remaining sections excluding the initialization section are omitted or simplified.

According to some embodiments, in the first initialization section IS1, the second gate signal GC may have a high level and the third gate signal GI may have a high level. That is, in the first initialization section IS1, both the second gate signal GC and the third gate signal GI may have activation levels. In this case, the third transistor T3 may be turned on in response to the second gate signal GC, and the fourth transistor T4 may be turned on in response to the third gate signal GI. Accordingly, during the first initialization section IS1, the gate electrode of the first transistor T1 may be initialized.

According to some embodiments, in the second initialization section IS2, the second gate signal GC may have a low level and the third gate signal GI may have a high level. That is, in the second initialization section IS2, the third gate signal GI may have an activation level. In this case, the third transistor T3 may be turned off in response to the second gate signal GC, and the fourth transistor T4 may be turned on in response to the third gate signal GI. Accordingly, in the second initialization section IS2, the second electrode (e.g., a drain electrode) of the first transistor T1 may be initialized. At this time, the second initialization section IS2 may be a section between the first initialization section IS1 and a light emitting section ES. In addition, the second initialization section IS2 may be closer to the light emitting section ES than the first initialization section IS1.

That is, the first initialization operation and the second initialization operation may be controlled by the same third gate signal GI.

In the light emitting section ES in which the light emitting operation is performed, the light emitting control signal EM may have a low level. Accordingly, the pixel PX may emit light during the light emitting period ES.

According to some embodiments, as described above, the first electrode of the fourth transistor T4 may be connected to the fourth node N4, which is connected to the second node N2. In other words, the second electrode of the fourth transistor T4 may be connected to the second electrode of the first transistor T1. At this time, the second electrode of the fourth transistor T4 may be a drain electrode, and the second electrode of the first transistor T1 may be a drain electrode. In this case, for one frame, each pixel PX may perform the first initialization operation in which the gate electrode of the first transistor T1 is initialized, and the second initialization operation in which the second electrode of the first transistor T1 is initialized after the first initialization operation and immediately before the pixel PX emits light. That is, immediately before the pixel PX emits light, the charge accumulated on the second electrode of the first transistor T1 may be bypassed by the bias voltage VOBS. Accordingly, the black voltage corresponding to the black gradation may be reduced. In addition, bright spot defects in the image due to current leakage of the fourth transistor T4 may be prevented or reduced.

Figure 4:
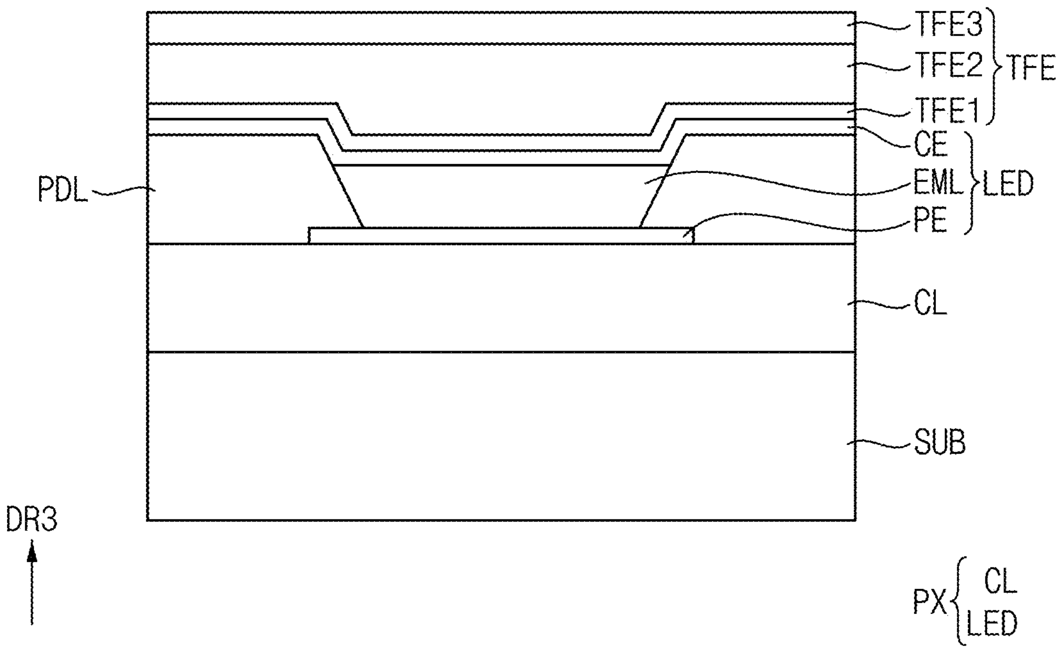
FIG. 4 is a cross-sectional view schematically showing the display panel of FIG. 1.

FIG. 4 is a cross-sectional view schematically showing the display panel of FIG. 1. For example, FIG. 4 is a cross-sectional view schematically showing an example of a cross-section of each pixel PX in FIG. 1.

Referring to FIG. 4, the display panel DP may include a substrate SUB, a circuit layer CL, the light emitting element LED, a pixel defining layer PDL, and an encapsulation layer TFE.

The substrate SUB may include a transparent material or an opaque material. The substrate SUB may be made of a transparent resin substrate. Examples of the transparent resin substrate may include a polyimide substrate. In this case, the polyimide substrate may include a first organic layer, a first barrier layer, a second organic layer, and the like. Alternatively, the substrate SUB may include a quartz substrate, synthetic quartz substrate, calcium fluoride substrate, F-doped quartz substrate, a soda-lime glass substrate, a non-alkali glass substrate, and the like. These can be used alone or in combination with each other.

The circuit layer CL may be located on the substrate SUB. The circuit layer CL may provide signals and voltages for the light emitting element LED to emit light to the light emitting element EL. For example, the circuit layer CL may include a transistor, a conductive layer, an insulating layer, and the like.

A pixel electrode PE may be located on the circuit layer CL. The pixel electrode PE may receive the signals and voltages from the circuit layer CL. For example, the pixel electrode PE may include metal, alloy, metal nitride, conductive metal oxide, transparent conductive material, and the like. These can be used alone or in combination with each other. For example, the pixel electrode PE may be an anode electrode.

The pixel defining layer PDL may be located on the circuit layer CL and the pixel electrode PE. The pixel defining layer PDL may define an opening exposing at least a portion of the pixel electrode PE. As the pixel defining layer PDL defines the opening, the pixel defining layer PDL may define each pixel PX which emits light. The pixel defining layer PDL may include organic materials and/or inorganic materials. Examples of the organic materials that can be used as a pixel defining layer PDL may include photoresist, polyacrylic resin, polyimide resin, polyamide resin, siloxane resin, acrylic resin, epoxy resin, and the like. These can be used alone or in combination with each other.

A light emitting layer EML may be located on the pixel electrode PE. For example, the light emitting layer EML may be located within the opening of the pixel defining layer PDL. The light emitting layer EML may include materials for emitting light. For example, the light emitting layer EML may include an organic light emitting material or an inorganic light emitting material.

A common electrode CE may be located on the pixel defining layer PDL and the light emitting layer EML. For example, the common electrode CE may include metal, alloy, metal nitride, conductive metal oxide, transparent conductive material, and the like. These can be used alone or in combination with each other. For example, the common electrode CE may be a cathode electrode.

Accordingly, a light emitting element LED including the pixel electrode PE, the light emitting layer EML, and the common electrode CE may be located on the substrate SUB. The circuit layer CL and the light emitting element LED may form one pixel PX.

The encapsulation layer TFE may be located on the common electrode CE. The encapsulation layer TFE may protect the light emitting element LED from external oxygen and moisture. The encapsulation layer TFE may include at least one inorganic layer and at least one organic layer. For example, the encapsulation layer TFE may include a first inorganic layer TFE1 located on the common electrode CE, an organic layer TFE2 located on the first inorganic layer TFE1, and a second inorganic layer TFE3 located on the organic layer TFE2.

Figure 5:
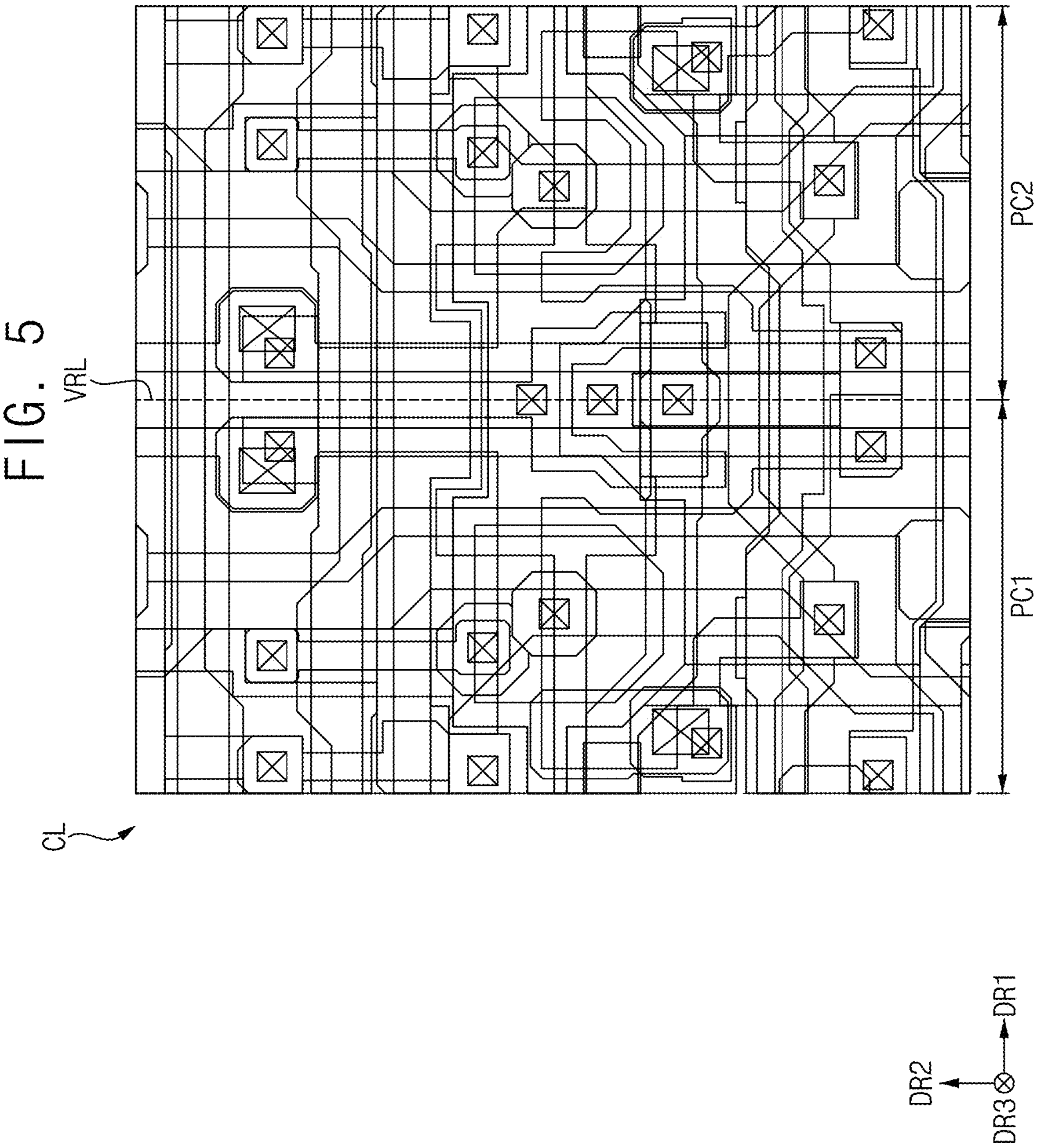
FIG. 5 is a layout view showing a circuit layer of FIG. 4.
Figure 20:
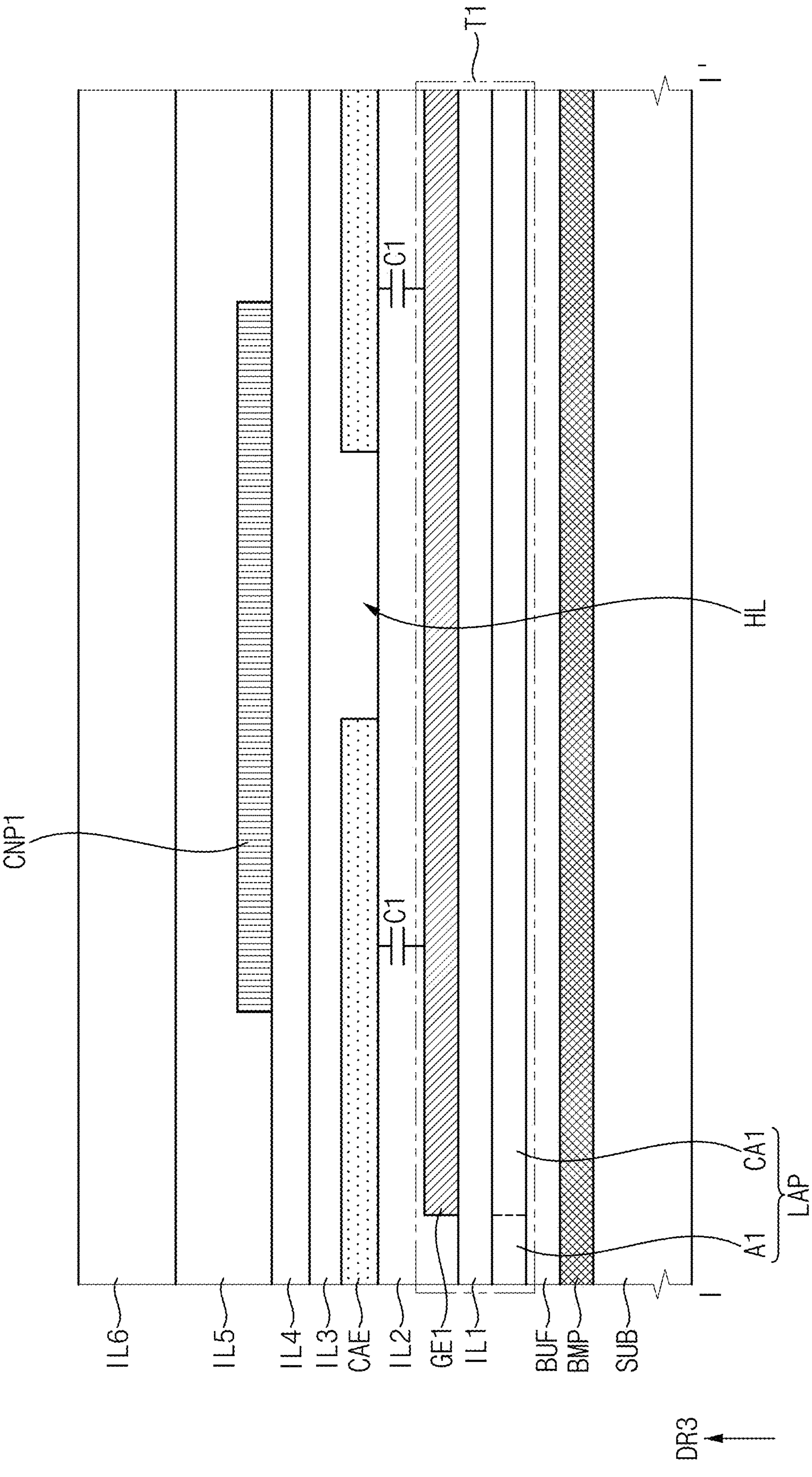
FIG. 20 is a cross-sectional view taken along the line I-I' of FIG. 18.
Figure 21:
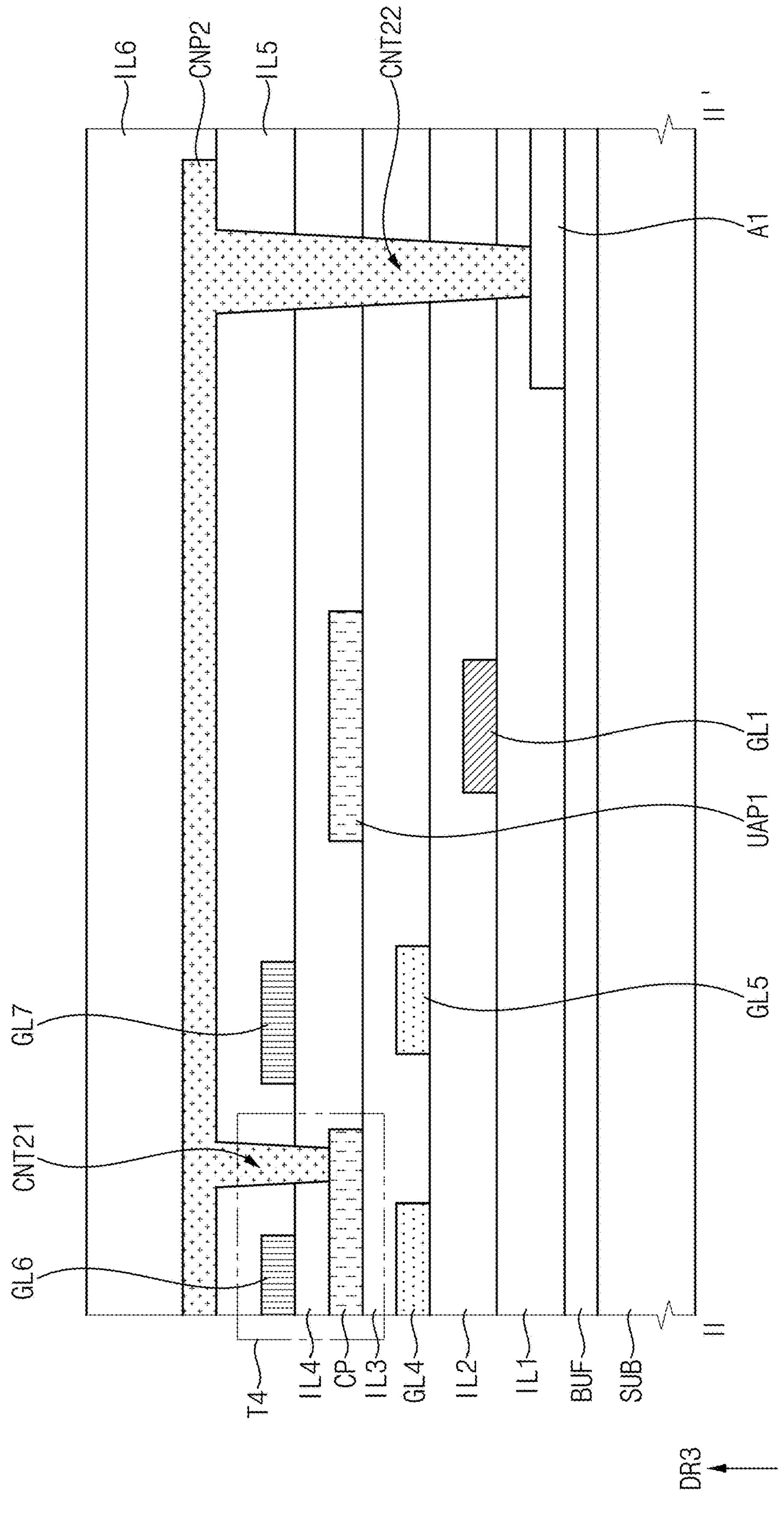
FIG. 21 is a cross-sectional view taken along the line II-II' of FIG. 18.

FIG. 5 is a layout view showing a circuit layer of FIG. 4. FIGS. 6, 7, 8, 9, 10, 11, 12, 13, 14, 15, 16, 17, 18, and 19 are layout views for explaining the components of the circuit layer of FIG. 5. FIG. 20 is a cross-sectional view taken along the line I-I' of FIG. 18. FIG. 21 is a cross-sectional view taken along the line II-II' of FIG. 18.

Referring to FIG. 5, the circuit layer CL may include a first pixel circuit PC1 and a second pixel circuit PC2 adjacent to each other in the first direction DR1. The second pixel circuit PC2 may have a structure that is substantially symmetrical to the structure of the first pixel circuit PC1 with respect to a virtual symmetry line VRL extending in the second direction DR2. The first pixel circuit PC1 and the second pixel circuit PC2 may each correspond to the pixel circuit PC of FIG. 2. Hereinafter, the description will be based on the components of the first pixel circuit PC1.

Figure 6:
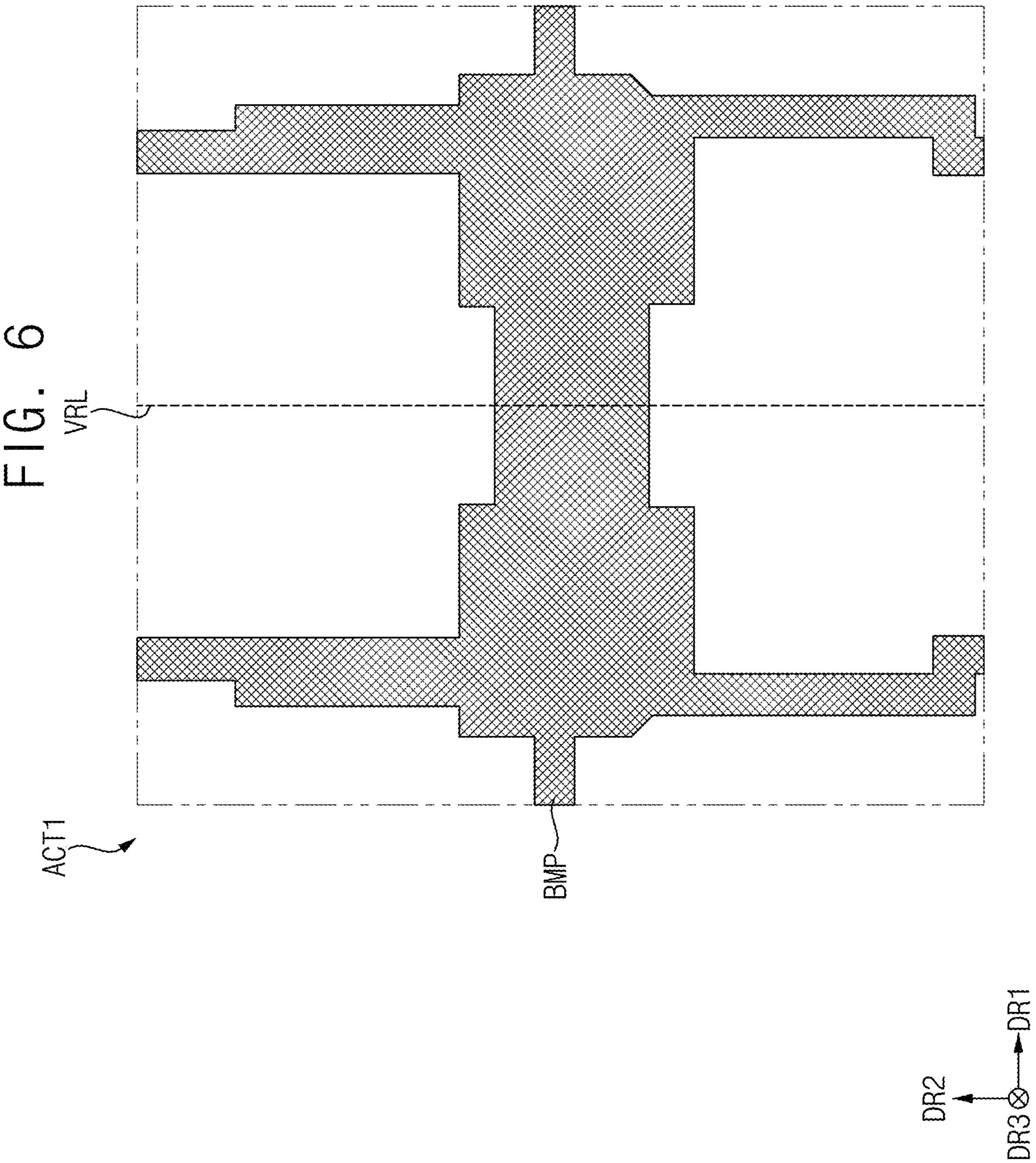
FIGS. 6, 7, 8, 9, 10, 11, 12, 13, 14, 15, 16, 17, 18, and 19 are layout views for explaining the components of the circuit layer of FIG. 5.

Referring further to FIG. 6, the circuit layer CL may include a lower metal layer BML located on the substrate SUB. The lower metal layer BML may include a lower metal pattern BMP.

A first power voltage (e.g., the first power voltage ELVDD of FIG. 2) may be applied to the lower metal pattern BMP. For example, the lower metal layer BML may include metal, alloy, metal nitride, conductive metal oxide, transparent conductive material, and the like. These can be used alone or in combination with each other.

Figure 7:
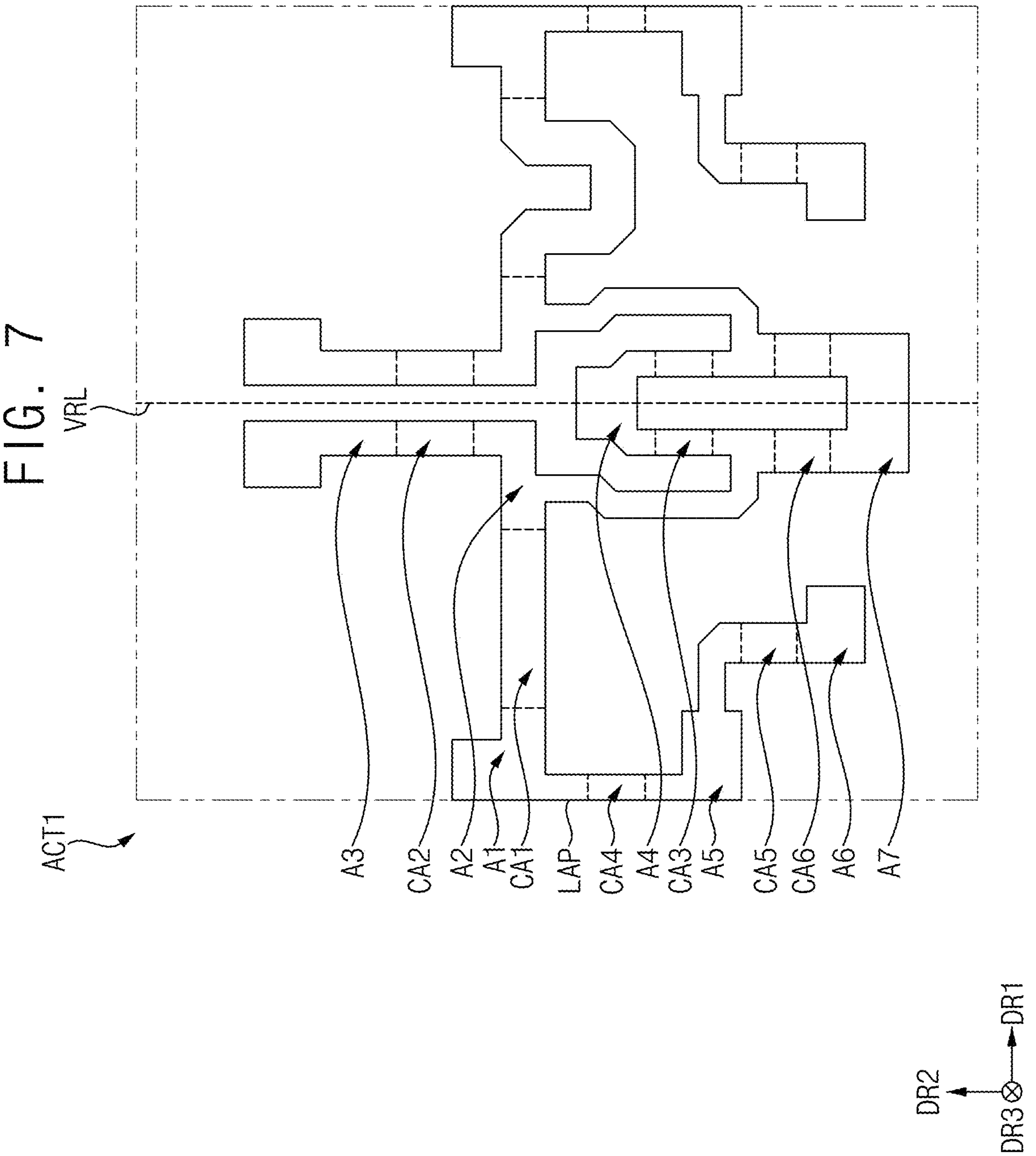
Figure 8:
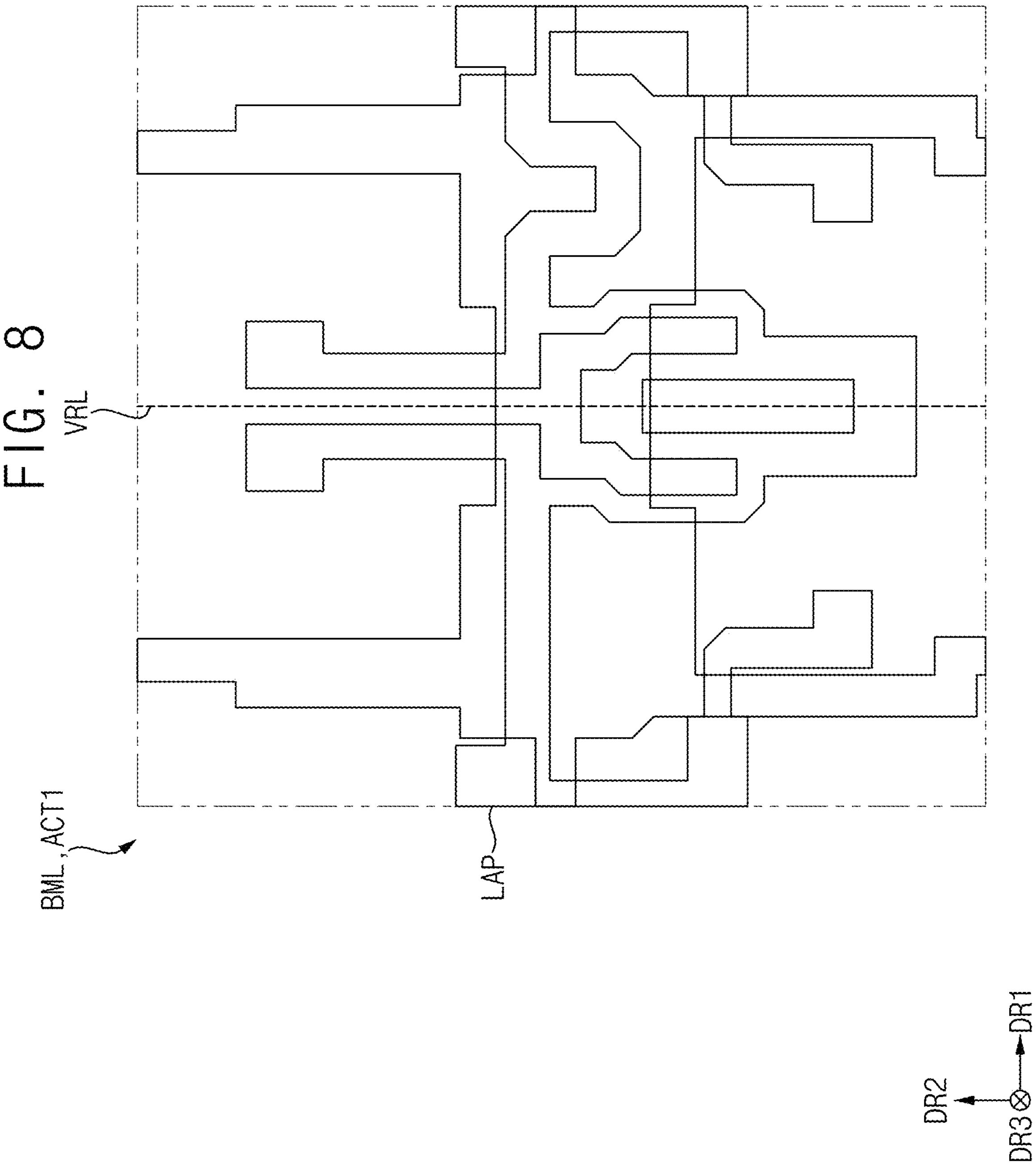

Referring further to FIGS. 7 and 8, the circuit layer CL may further include a first active layer ACT1 located on the lower metal layer BML. For example, the buffer layer BUF may be located on the lower metal layer BML, and the first active layer ACT1 may be located on the buffer layer BUF. For example, the buffer layer BUF may include a silicon compound such as silicon oxide, silicon nitride, and the like. These can be used alone or in combination with each other (see FIGS. 20 and 21).

The first active layer ACT1 may include a lower active pattern LAP1. The lower active pattern LAP1 may include first, second, third, fourth, fifth, and sixth channel areas CA1, CA2, CA3, CA4, CA5, and CA6 spaced apart from each other. In addition, the lower active pattern LAP1 may further include first, second third, fourth, fifth, sixth, and seventh areas A1, A2, A3, A4, A5, A6, and A7 spaced apart from each other.

Figure 9:
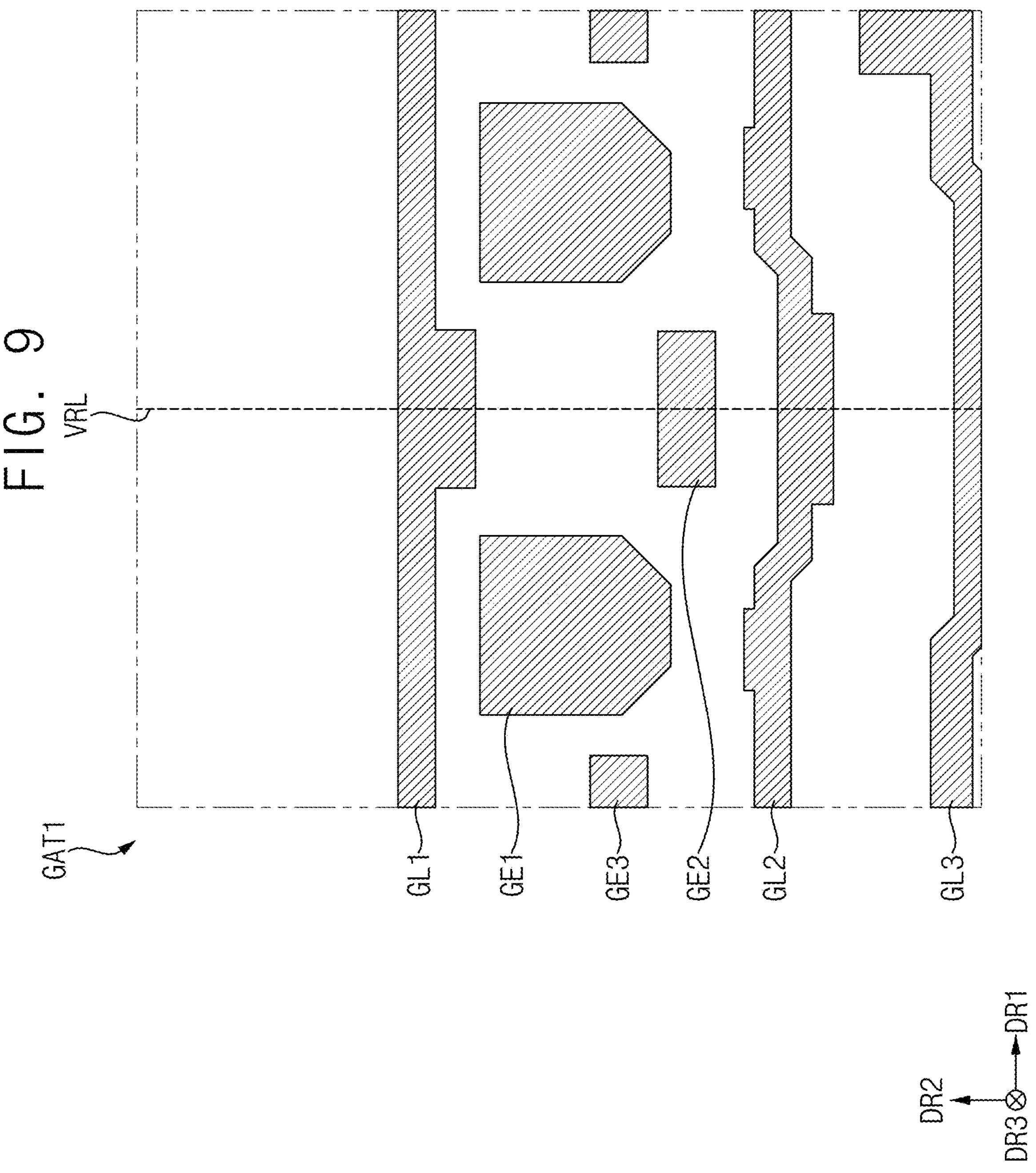

Each of the first, second third, fourth, fifth, sixth, and seventh areas A1, A2, A3, A4, A5, A6, and A7 may be a doped area in which impurities (e.g., P-type impurities) are doped after a first gate layer GAT1 of FIG. 9 is formed. In contrast, the first, second, third, fourth, fifth, and sixth channel areas CA1, CA2, CA3, CA4, CA5, and CA6 may not be doped with impurities.

The first area A1 may be located between the first channel area CA1 and the second channel area CA2. The second area A2 may be located between the first channel area CA1, the third channel area CA3, and the sixth channel area CA6. The third area A3 may be located adjacent to the second channel area CA2. The fourth area A4 may be located adjacent to the third channel area CA3. The fifth area A5 may be located between the fourth channel area CA4 and the fifth channel area CA5. The sixth area A6 may be located adjacent to the fifth channel area CA5. The seventh area A7 may be located adjacent to the sixth channel area CA6.

According to some embodiments, the first active layer ACT1 may include a silicon semiconductor such as amorphous silicon, polycrystalline silicon, and the like. However, embodiments of the present invention are not necessarily limited thereto, and the first active layer ACT1 may include a metal oxide semiconductor.

Figure 10:
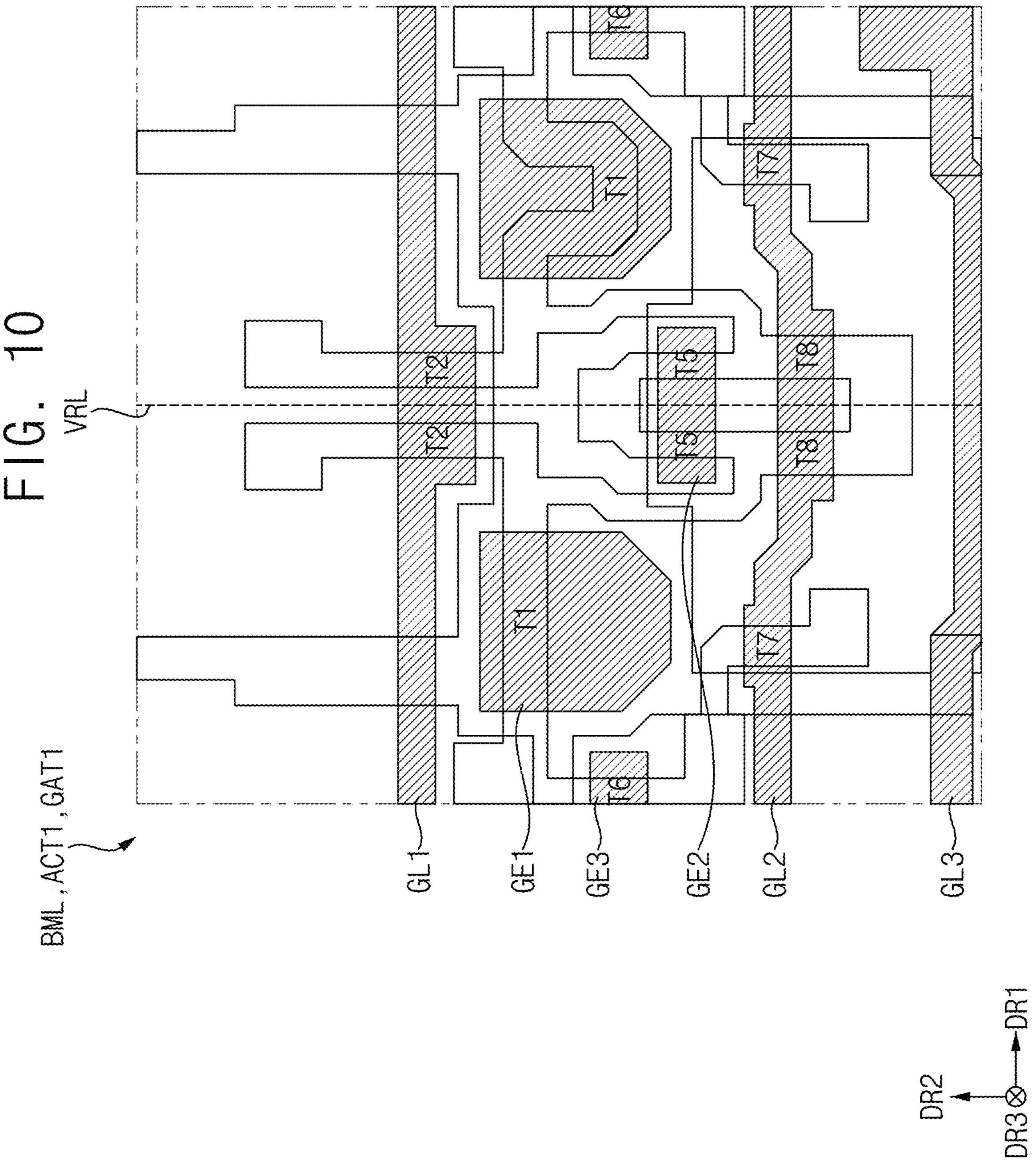

Referring further to FIGS. 9 and 10, the circuit layer CL may further include the first gate layer GAT1 located on the first active layer ACT1. For example, a first insulating layer IL1 may be located on the first active layer GAT1, and the first gate layer GAT1 may be located on the first insulating layer IL1. For example, the first insulating layer IL1 may include a silicon compound such as silicon oxide, silicon nitride, and the like. These can be used alone or in combination with each other (see FIGS. 20 and 21).

The first gate layer GAT1 may include a first gate line GL1, a second gate line GL2, a third gate line GL3, a first gate electrode GE1, a second gate electrode GE2, and a third gate electrode GE3. The first gate line GL1, the second gate line GL2, the third gate line GL3, the first gate electrode GE1, the second gate electrode GE2, and the third gate electrode GE3 may be located to be spaced apart from each other.

The first gate line GL1, the second gate line GL2, the third gate line GL3, the first gate electrode GE1, the second gate electrode GE2, and the third gate electrode GE3 may be located in the same layer. In addition, the first gate line GL1, the second gate line GL2, the third gate line GL3, the first gate electrode GE1, the second gate electrode GE2, and the third gate electrode GE3 may include the same material and be formed through the same process.

The first gate electrode GE1 may overlap (e.g., partially overlap) the lower metal pattern BMP and the lower active pattern LAP in the plan view. The first channel area CA1, the first area A1, and the second area A2 of the lower active pattern LAP may constitute the first transistor T1 together with a portion (i.e., a gate electrode) of the first gate electrode GE1 overlapping the first channel area CA1. That is, the first transistor T1 may include the first channel area CA1, the first area A1, the second area A2, and the portion of the first gate electrode GE1. The first transistor T1 may further include a portion (i.e., a back gate electrode) of the lower metal pattern BMP overlapping the lower active pattern LAP in the plan view.

The first transistor T1 may correspond to the first transistor T1 of FIG. 2. That is, a first end of the first area A1 and a first end of the second area A2 of the first transistor T1 may correspond to the second electrode (e.g., a drain electrode) and the first electrode (e.g., a source electrode) of the first transistor T1, respectively.

The first gate line GL1 may extend in the first direction DR1. The first gate line GL1 may overlap (e.g., partially overlap) the lower metal pattern BMP and the lower active pattern LAP in a plan view. A first gate signal (e.g., the first gate signal GW of FIG. 2) may be applied to the first gate line GL1.

The second channel area CA2, the second area A2, and the third area A3 of the lower active pattern LAP may constitute the second transistor T2 together with a portion (i.e., a gate electrode) of the first gate line GL1 overlapping the second channel area CA2. That is, the second transistor T2 may include the second channel area CA2, the second area A2, the third area A3, and the portion of the first gate line GL1.

The second transistor T2 may correspond to the second transistor T2 of FIG. 2. That is, a second end of the second area A2 and the third area A3 of the second transistor T2 may correspond to the second electrode (e.g., a drain electrode) and the first electrode (e.g., a source electrode) of the second transistor T2, respectively.

The second gate electrode GE2 may overlap (e.g., partially overlap) the lower active pattern LAP in a plan view. The second gate electrode GE2 may include a first portion and a second portion that are symmetrical with respect to the virtual symmetry line VRL. The third channel area CA3, the second area A2, and the fourth area A4 of the lower active pattern LAP may constitute the fifth transistor T5 together with a portion of the second gate electrode GE2 overlapping the third channel area CA3. That is, the fifth transistor T5 may include the third channel area CA3, the second area A2, the fourth area A4, and the portion of the second gate electrode GE2.

The fifth transistor T5 may correspond to the fifth transistor T5 of FIG. 2. That is, a third end of the second area A2 and the fourth area A4 of the fifth transistor T5 may correspond to the second electrode (e.g., a drain electrode) and the first electrode (e.g., a source electrode) of the fifth transistor T5, respectively.

The third gate electrode GE3 may overlap (e.g., partially overlap) the lower active pattern LAP in the plan view. The fourth channel area CA4, the first area A1, and the fifth area A5 of the lower active pattern LAP may constitute the sixth transistor T6 together with a portion of the third gate electrode GE3 overlapping the fourth channel area CA4. That is, the sixth transistor T6 may include the fourth channel area CA4, the first area A1, the fifth area A5, and the portion of the third gate electrode GE3.

The sixth transistor T6 may correspond to the sixth transistor T6 of FIG. 2. That is, the second end of the first area A1 and a first end of the fifth area A5 of the sixth transistor T6 may correspond to the first electrode (e.g., a source electrode) and the second electrode (e.g., a drain electrode) of the sixth transistor T6.

The second gate line GL2 may extend in the first direction DR1. The second gate line GL2 may overlap (e.g., partially overlap) the lower metal pattern BMP and the lower active pattern LAP in the plan view. A fourth gate signal (e.g., the fourth gate signal GB of FIG. 2) may be applied to the second gate line GL2.

The fifth channel area CA5, the fifth area A5, and the sixth area A6 of the lower active pattern LAP may constitute the seventh transistor T7 together with a portion of the second gate line GL2 overlapping the fifth channel area CA5. That is, the seventh transistor T7 may include the fifth channel area CA5, the fifth area A5, the sixth area A6, and the portion of the second gate line GL2.

The seventh transistor T7 may correspond to the seventh transistor T7 of FIG. 2. That is, a second end of the fifth area A5 and the sixth area A6 of the seventh transistor T7 may correspond to the second electrode (e.g., a drain electrode) and the first electrode (e.g., a source electrode) of the seventh transistor T7, respectively.

The sixth channel area CA6, second area A2, and seventh area A7 of the lower active pattern LAP may constitute the eighth transistor T8 together with a portion of the second gate line GL2 overlapping the sixth channel area CA6. That is, the eighth transistor T8 may include the sixth channel area CA6, the second area A2, the seventh area A7, and the portion of the second gate line GL2.

The eighth transistor T8 may correspond to the eighth transistor T8 of FIG. 2. That is, a fourth end of the second area A2 and the seventh area A7 of the eighth transistor T8 may correspond to the second electrode (e.g., drain electrode) and the first electrode (e.g., a source electrode) of the eighth transistor T8, respectively.

The third gate line GL3 may extend in the first direction DR1. The third gate line GL3 may be located under the second gate line GL2 in the plan view. The third gate line GL3 may overlap (e.g., partially overlap) the lower metal pattern BMP in the plan view.

Each of the first gate line GL1, the second gate line GL2, and the third gate line GL3 may be referred to as a lower gate line.

Accordingly, the first pixel circuit PC1 may include the first transistor T1, the second transistor T2, and the fifth, sixth, seventh, and eighth transistors T5, T6, T7, and T8, and the second pixel circuit PC2 may also include the first transistor T1, the second transistor T2, and the fifth, sixth, seventh, and eighth transistors T5, T6, T7, and T8.

For example, the first gate layer GAT1 may include metal, alloy, metal nitride, conductive metal oxide, transparent conductive material, and the like. These can be used alone or in combination with each other.

Figure 11:
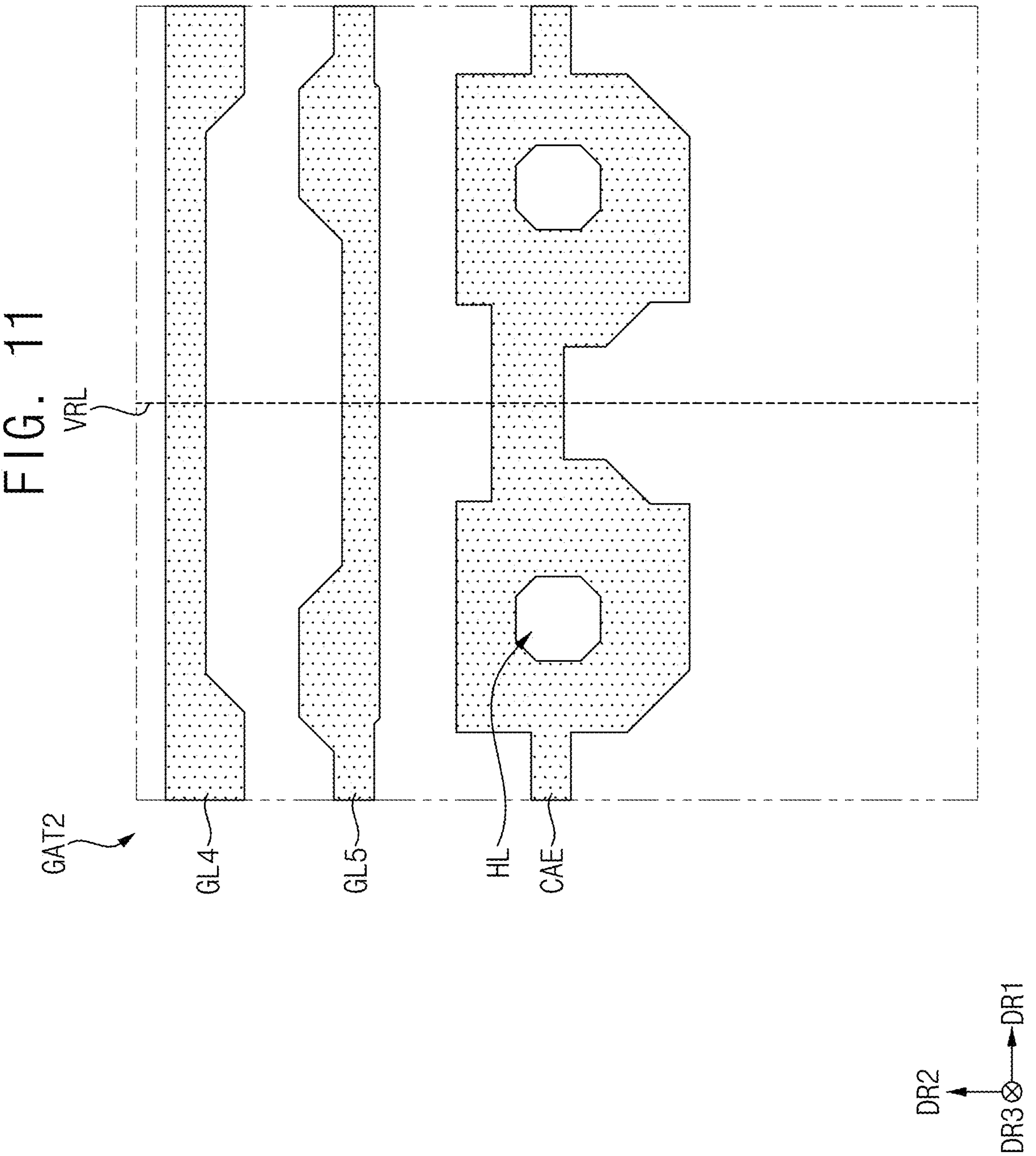
Figure 12:
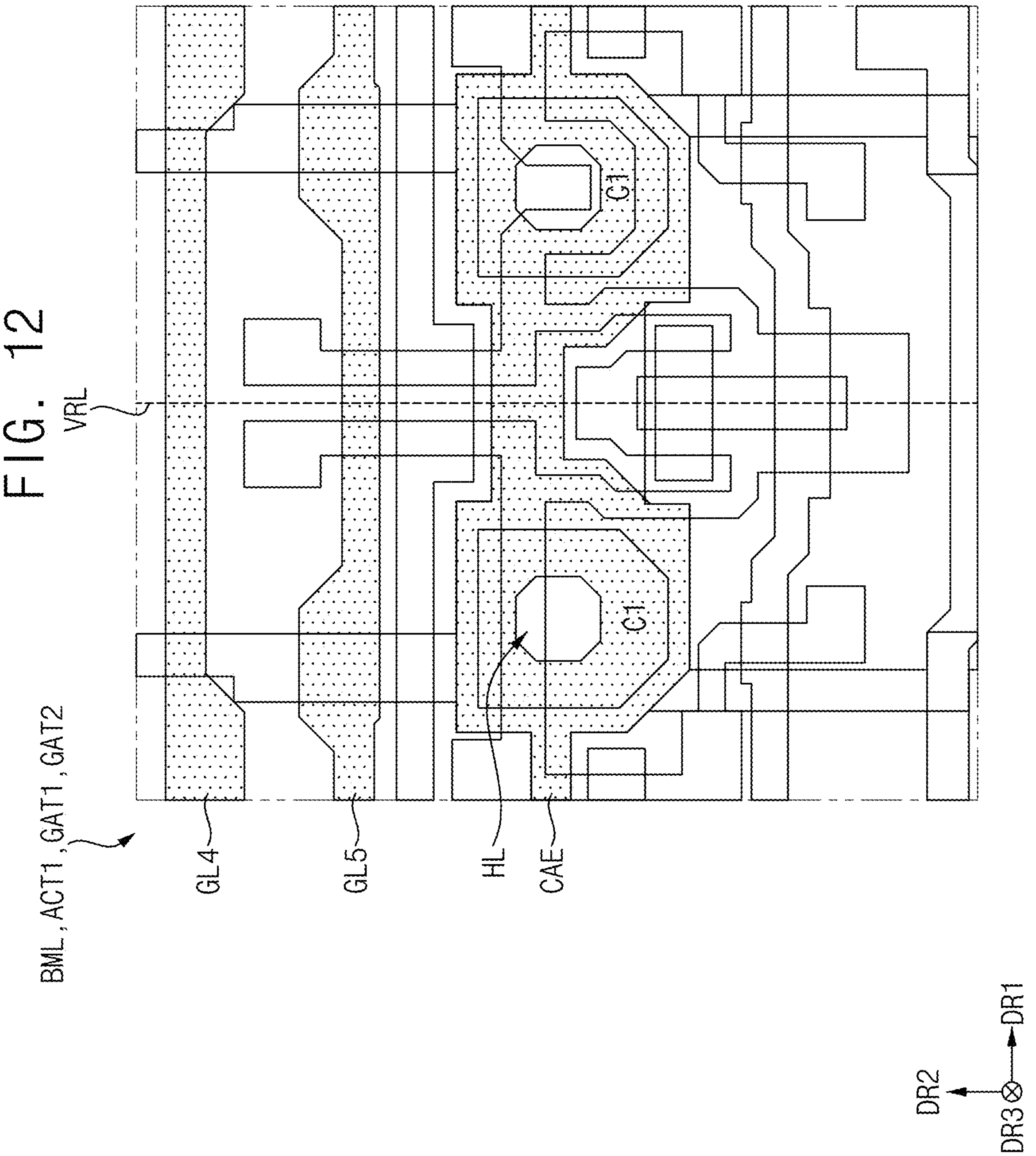

Referring further to FIGS. 11 and 12, the circuit layer CL may further include a second gate layer GAT2 located on the first gate layer GAT1. For example, a second insulating layer IL2 may be located on the first gate layer GAT1, and the second gate layer GAT2 may be located on the second insulating layer IL2. For example, the second insulating layer IL2 may include a silicon compound such as silicon oxide, silicon nitride, and the like. These can be used alone or in combination with each other (see FIGS. 20 and 21).

The second gate layer GAT2 may include a fourth gate line GL4, a fifth gate line GL5, and a capacitor electrode CAE spaced apart from each other. The fourth gate line GL4, the fifth gate line GL5, and the capacitor electrode CAE may include the same material. In addition, the fourth gate line GL4, the fifth gate line GL5, and the capacitor electrode CAE include the same material and may be formed through the same process.

The fourth gate line GL4 may extend in the first direction DR1. The fourth gate line GL4 may overlap (e.g., partially overlap) the lower metal pattern BMP in a plane view. A third gate signal (e.g., the third gate signal GI of FIG. 3) may be applied to the fourth gate line GL4.

The fifth gate line GL5 may extend in the first direction DR1. The fifth gate line GL5 may overlap (e.g., partially overlap) the lower metal pattern BMP and the lower active pattern LAP in the plan view. The fifth gate line GL5 may be located under the fourth gate line GL4 in the plan view. A second gate signal (e.g., the second gate signal GC of FIG. 3) may be applied to the fifth gate line GL5.

Each of the fourth gate line GL4 and the fifth gate line GL5 may be referred to as a middle gate line.

The capacitor electrode CAE may extend in the first direction DR1. The capacitor electrode CAE may overlap (e.g., partially overlap) the first gate electrode GE1 on a plane. A hole HL may be defined in the capacitor electrode CAE. The hole HL may expose at least a portion of the first gate electrode GE1.

The first gate electrode GE1 and a portion of the capacitor electrode CAE overlapping the first gate electrode GE1 may constitute the first capacitor C1. That is, the first capacitor C1 may include the first gate electrode GE1 and the portion of the capacitor electrode CAE. The first capacitor C1 may correspond to the first capacitor C1 of FIG. 2.

Accordingly, the first pixel circuit PC1 may further include the first capacitor C1, and the second pixel circuit PC2 may further include the first capacitor C1.

For example, the second gate layer GAT2 may include metal, alloy, metal nitride, conductive metal oxide, transparent conductive material, and the like. These can be used alone or in combination with each other.

Figure 13:
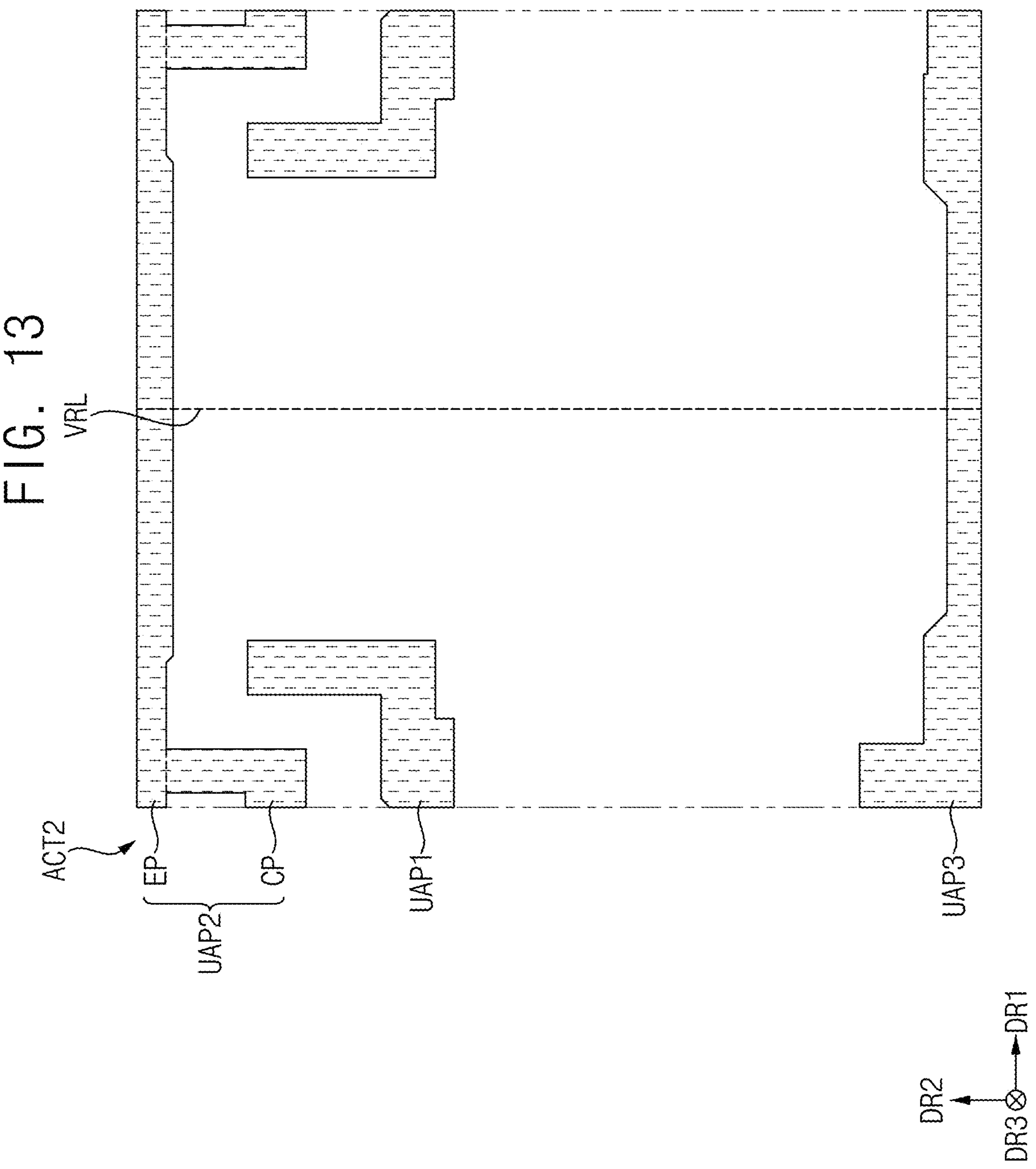
Figure 14:
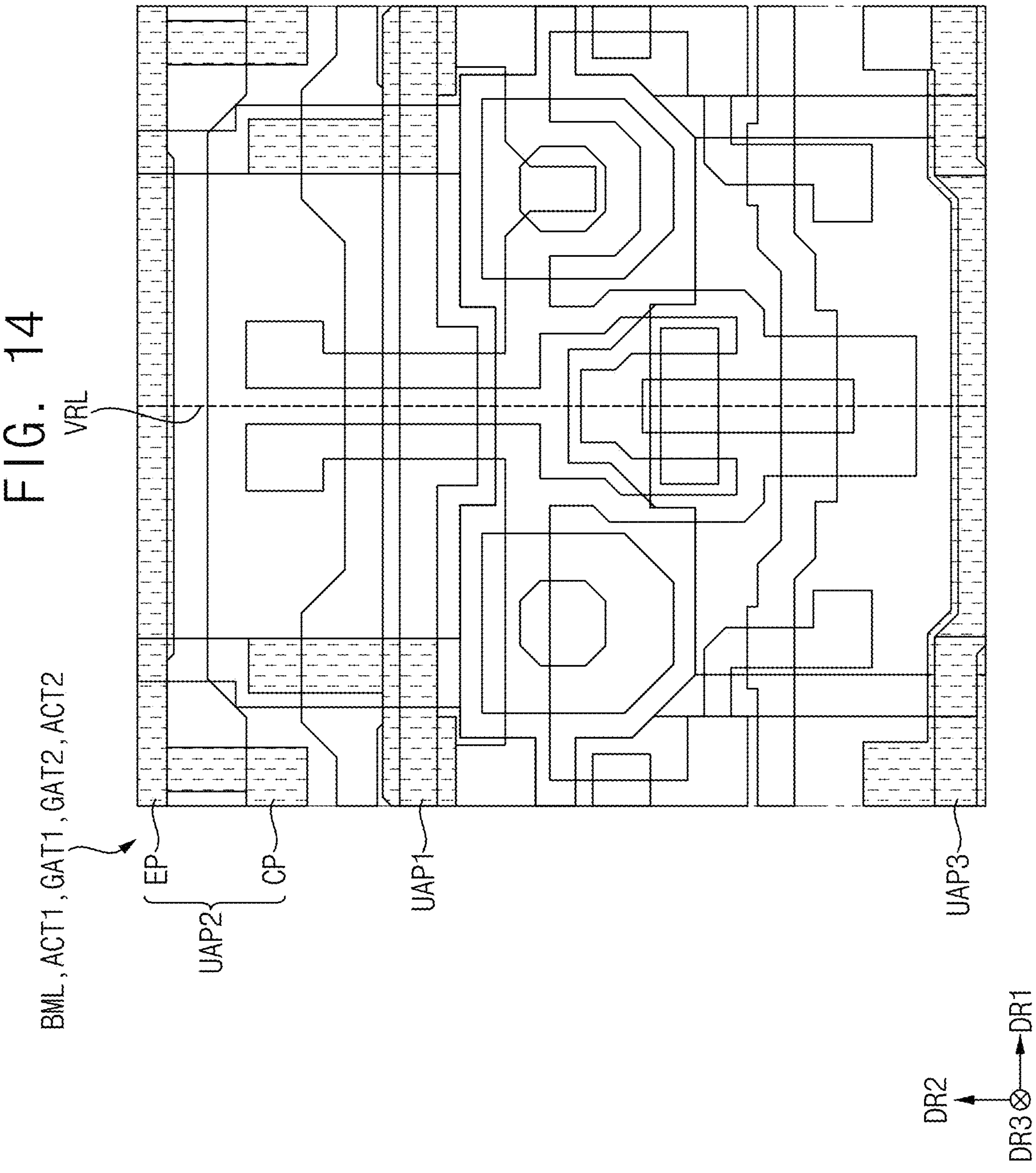

Referring further to FIGS. 13 and 14, the circuit layer CL may further include a second active layer ACT2 located on the second gate layer GAT2. For example, a third insulating layer IL3 may be located on the second gate layer GAT2, and the second active layer ACT2 may be located on the third insulating layer IL3. For example, the third insulating layer IL3 may include a silicon compound such as silicon oxide, silicon nitride, and the like. These can be used alone or in combination with each other (see FIGS. 20 and 21).

The second active layer ACT2 may include a first upper active pattern UAP1, a second upper active pattern UAP2, and a third upper active pattern UAP3 spaced apart from each other. The first upper active pattern UAP1, the second upper active pattern UAP2, and the third upper active pattern UAP3 may be located in the same layer. In addition, the first upper active pattern UAP1, the second upper active pattern UAP2, and the third upper active pattern UAP3 may include the same material and may be formed through the same process.

The first upper active pattern UAP1 may overlap (e.g., partially overlap) the fifth gate line GL5 in the plan view.

The second upper active pattern UAP2 may overlap (e.g., partially overlap) the fourth gate line GL4 in the plan view. The second upper active pattern UAP2 may include an extension portion EP extending in the first direction DR1 and a connection portion CP protruding from the extension portion EP in a direction opposite to the second direction DR2.

The third upper active pattern UAP3 may extend in the first direction DR1. The third upper active pattern UAP3 may be located under the second upper active pattern UAP2 in the plan view. The third upper active pattern UAP3 may overlap (e.g., partially overlap) the third gate line GL3 in the plan view.

According to some embodiments, the second active layer ACT2 may include a metal oxide semiconductor (e.g., IGZO). However, embodiments of the present disclosure are not necessarily limited thereto.

Figure 15:
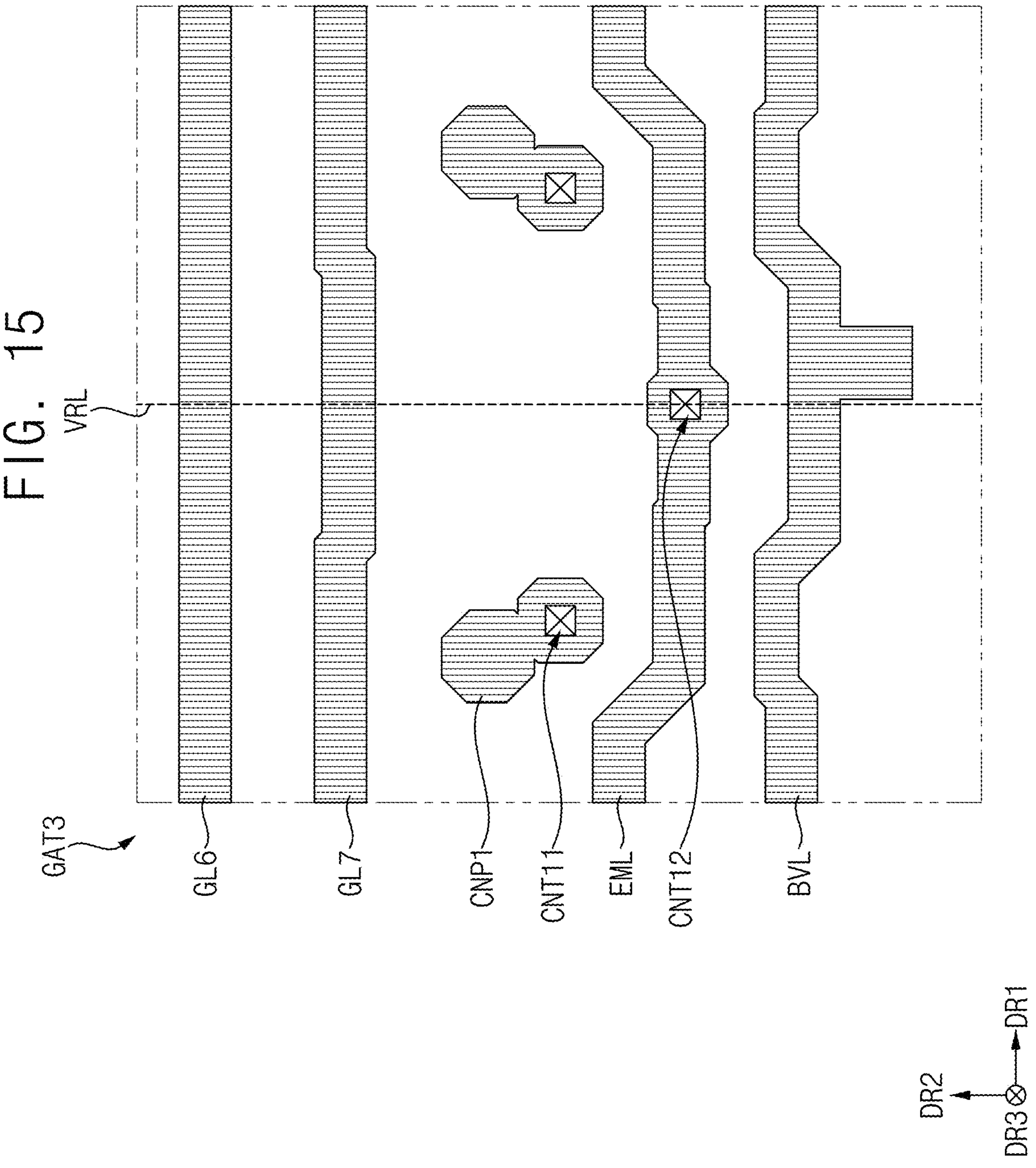
Figure 16:
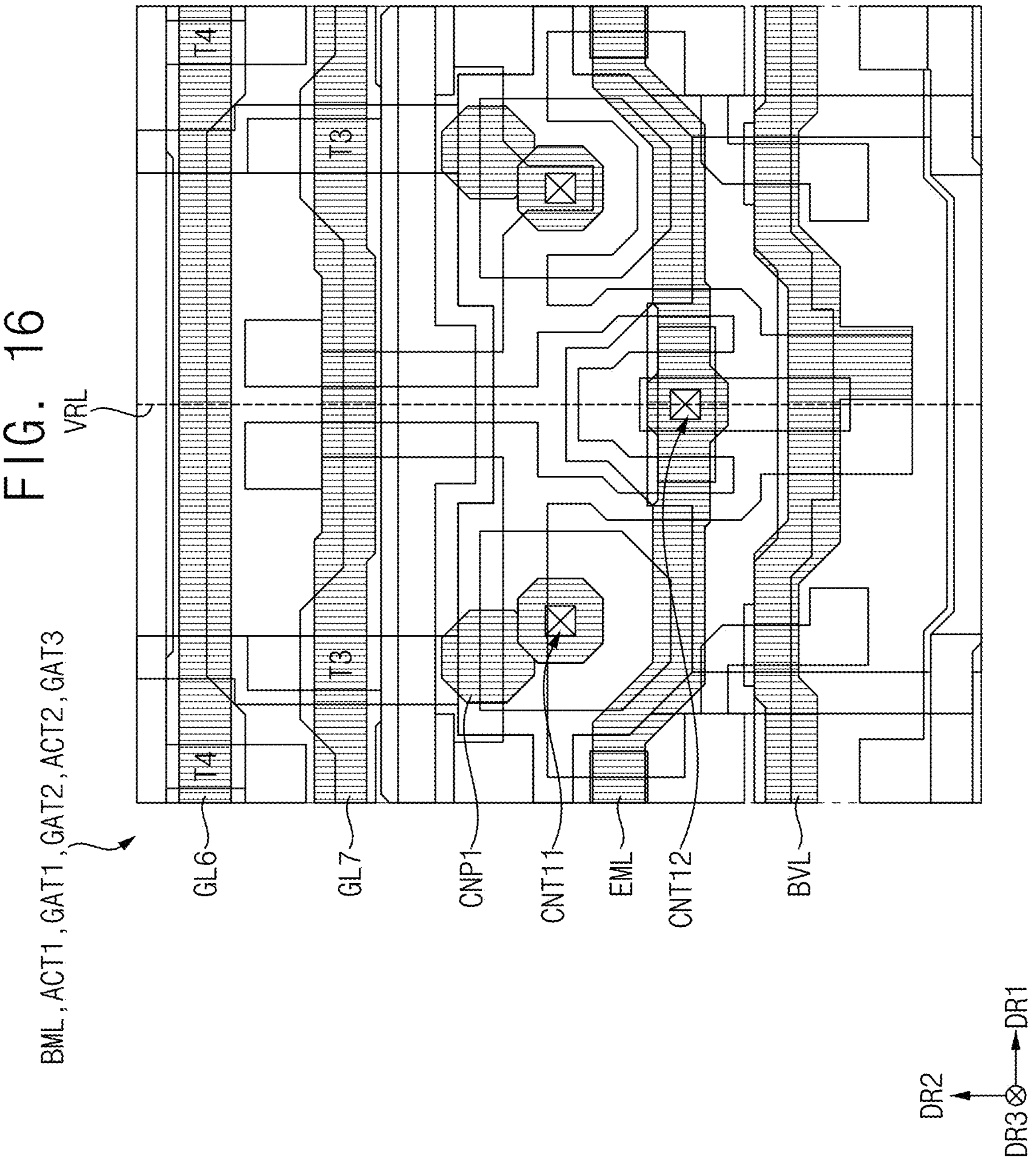

Referring further to FIGS. 15 and 16, the circuit layer CL may further include a third gate layer GAT3 located on the second active layer ACT2. For example, a fourth insulating layer IL4 may be located on the second active layer ACT2, and the third gate layer GAT3 may be located on the fourth insulating layer IL4. For example, the fourth insulating layer IL4 may include a silicon compound such as silicon oxide, silicon nitride, and the like. These can be used alone or in combination with each other (see FIGS. 20 and 21).

The third gate layer GAT3 may include a sixth gate line GL6, a seventh gate line GL7, a light emitting control line EML, a bias voltage line BVL, and a first connection pattern CNP1 spaced apart from each other.

The sixth gate line GL6, the seventh gate line GL7, the light emitting control line EML, the bias voltage line BVL, and the first connection pattern CNP1 may be located in the same layer. In addition, the sixth gate line GL6, the seventh gate line GL7, the light emitting control line EML, the bias voltage line BVL, and the first connection pattern CNP1 may include the same material and may be formed through the same process.

The sixth gate line GL6 may extend in the first direction DR1. A third gate signal (e.g., the third gate signal GI of FIG. 2) may be applied to the sixth gate line GL6. According to some embodiments, the sixth gate line GL6 may be connected to the fourth gate line GL4.

The sixth gate line GL6 may overlap (e.g., partially overlap) the second upper active pattern UAP2 in the plan view. For example, the sixth gate line GL6 may overlap (e.g., partially overlap) the connection portion CP of the second upper active pattern UAP2 in the plan view. The connection portion CP of the second upper active pattern UAP2 may constitute the fourth transistor T4 together with a portion (i.e., a gate electrode) of the sixth gate line GL6 overlapping the connection portion CP. That is, the fourth transistor T4 may include the connection portion CP and the portion of the sixth gate line GL6. The fourth transistor T4 may further include a portion (i.e., a back gate electrode) of the fourth gate line GL4 overlapping the second upper active pattern UAP2.

The fourth transistor T4 may correspond to the fourth transistor T4 of FIG. 2. That is, a portion of the expansion portion EP and a portion of the connection portion CP of the fourth transistor T4 may be correspond to the first electrode (e.g., a source electrode) and the second electrode (e.g., a drain electrode) of the fourth transistor T4, respectively. The fourth transistor T4 may be referred to as a first switching transistor.

The seventh gate line GL7 may extend in the first direction DR1. A second gate signal (e.g., the second gate signal GC of FIG. 2) may be applied to the seventh gate line GL7. According to some embodiments, the seventh gate line GL7 may be connected to the fifth gate line GL5.

The seventh gate line GL7 may overlap (e.g., partially overlap) the first upper active pattern UAP1 in the plan view. The first upper active pattern UAP1 may constitute the third transistor T3 together with a portion (i.e., a gate electrode) of the seventh gate line GL7 overlapping the first upper active pattern UAP1. That is, the third transistor T3 may include the first upper active pattern UAP1 and the portion of the seventh gate line GL7. The third transistor T3 may further include a portion (i.e., a back gate electrode) of the fifth gate line GL5 overlapping the first upper active pattern UAP1.

The third transistor T3 may correspond to the third transistor T3 of FIG. 2. That is, a first end area connected to the connection portion CP of the first upper active patter UAP1 and a second end area opposite to the first end area of the first upper active pattern UAP1 of the third transistor T3 may correspond to the first electrode (e.g., a source electrode) and the second electrode (e.g., a drain electrode) of the third transistor T3, respectively.

Each of the sixth gate line GL6 and the seventh gate line GL7 may be referred to as an upper gate line.

The first connection pattern CNP1 may be connected to the first gate electrode GE1 through a first-first contact hole CNT11. For example, the first connection pattern CNP1 may be connected to a portion of the first gate electrode GE1 exposed by the hole HL of the capacitor electrode CAE through the first-first contact hole CNT11.

The light emitting control line EML may extend in the first direction DR1. The light emitting control line EML may be connected to the second gate electrode GE2 through a first-second contact hole CNT12. A light emitting control signal (e.g., the light emitting control signal EM of FIG. 2) may be applied to the light emitting control line EML. Accordingly, the light emitting control line EML may transmit the light emitting control signal to the second gate electrode GE2.

The bias voltage line BVL may extend in the first direction DR1. A bias voltage (e.g., bias voltage VOBS of FIG. 2) may be applied to the bias voltage line BVL.

Accordingly, the first pixel circuit PC1 may further include the third and fourth transistors T3 and T4, and the second pixel circuit PC2 may further include the third and fourth transistors T3 and T4.

For example, the third gate layer GAT3 may include metal, alloy, metal nitride, conductive metal oxide, transparent conductive material, and the like. These can be used alone or in combination with each other.

Figure 17:
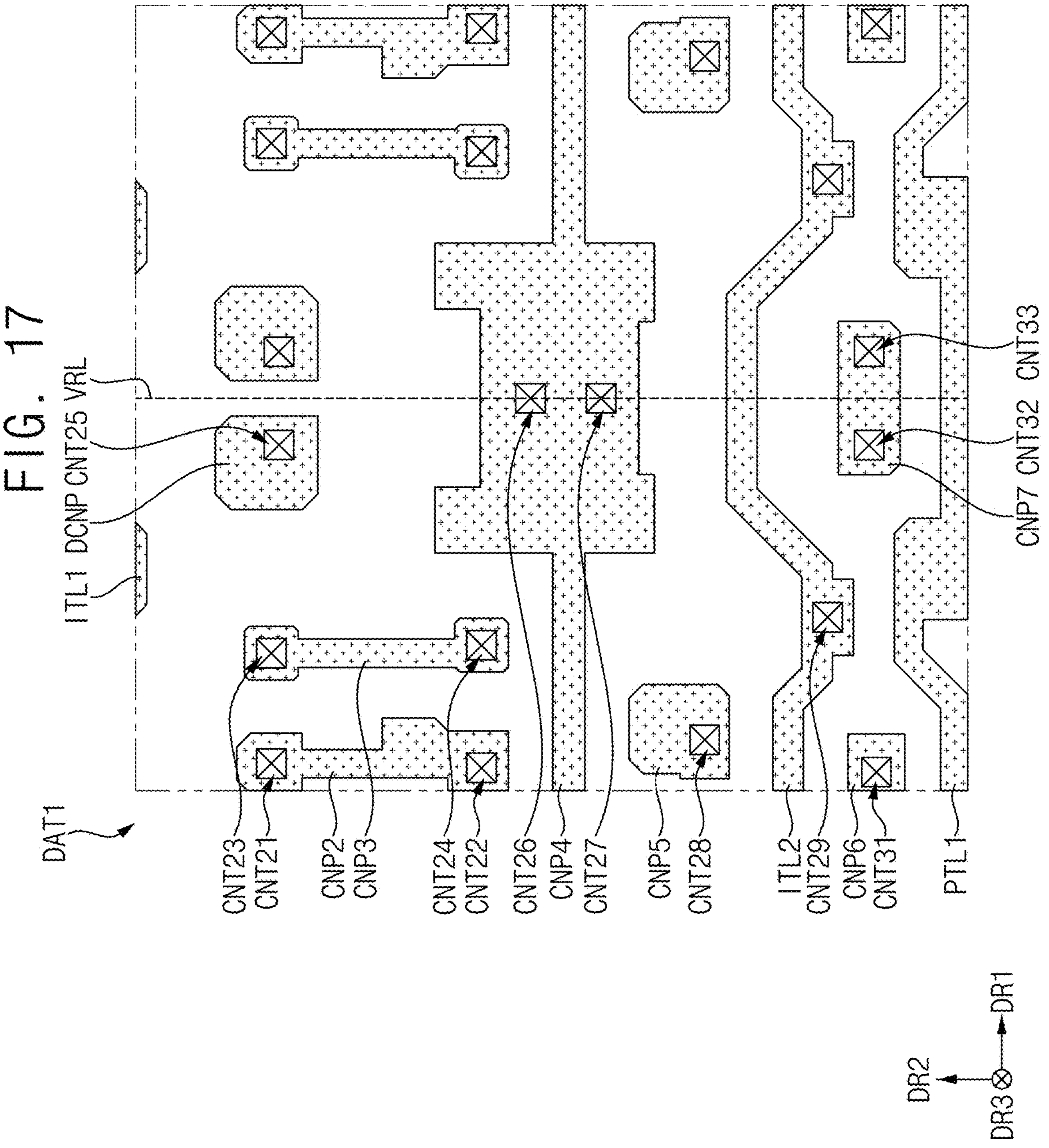
Figure 18:
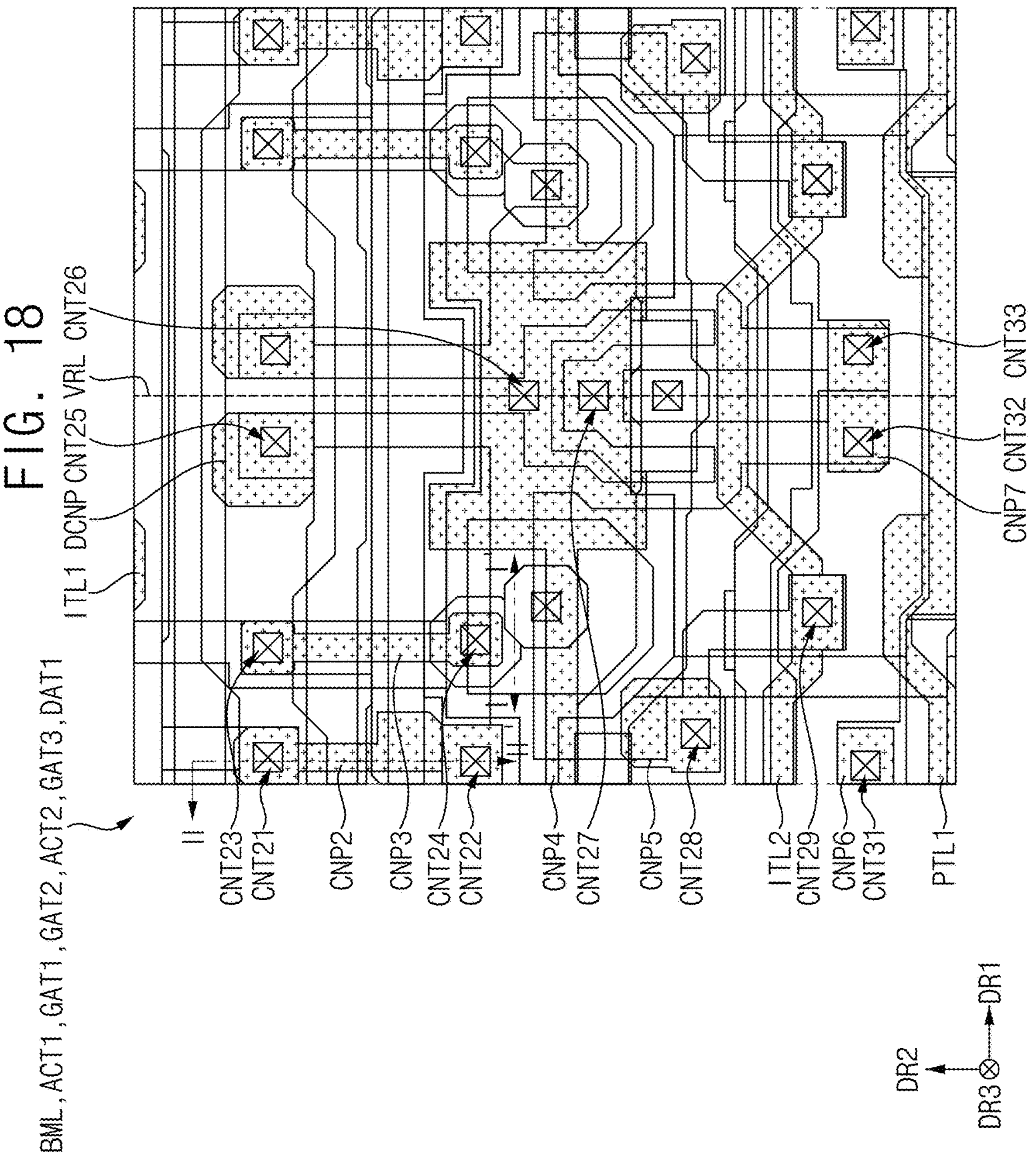

Referring further to FIGS. 17 and 18, the circuit layer CL may further include a first data conductive layer DAT1 located on the third gate layer GAT3. For example, a fifth insulating layer IL5 may be located on the third gate layer GAT3, and the first data conductive layer DAT1 may be located on the fifth insulating layer IL5. For example, the fifth insulating layer IL5 may include a silicon compound such as silicon oxide, silicon nitride, and the like. These can be used alone or in combination with each other (see FIGS. 20 and 21).

The first data conductive layer DAT1 may include a second connection pattern CNP2, a third connection pattern CNP3, a fourth connection pattern CNP4, a fifth connection pattern CNP5, a sixth connection pattern CNP6, a seventh connection pattern CNP7, a data connection pattern DCNP, a first initialization voltage line ITL1, a second initialization voltage line ITL2, and a first power voltage transmission line PTL1 spaced apart from each other.

The second connection pattern CNP2, the third connection pattern CNP3, the fourth connection pattern CNP4, the fifth connection pattern CNP5, the sixth connection pattern CNP6, the seventh connection pattern CNP7, the data connection pattern DCNP, the first initialization voltage line ITL1, the second initialization voltage line ITL2, and the first power voltage transmission line PTL1 may be located in the same layer. In addition, the second connection pattern CNP2, the third connection pattern CNP3, the fourth connection pattern CNP4, the fifth connection pattern CNP5, the sixth connection pattern CNP6, the seventh connection pattern CNP7, the data connection pattern DCNP, the first initialization voltage line ITL1, the second initialization voltage line ITL2, and the first power voltage transmission line PTL1 may include the same material and may be formed through the same process.

A first initialization voltage (e.g., the first initialization voltage VINT1 of FIG. 2) may be applied to the first initialization voltage line ITL1. According to some embodiments, the first initialization voltage line ITL1 may be connected to the second upper active pattern UAP2. Accordingly, the first initialization voltage line ITL1 may transmit the first initialization voltage to the second upper active pattern UAP2.

According to some embodiments, the second connection pattern CNP2 may connect the connection portion CP of the second upper active pattern UAP2 and the first area A1 of the lower active pattern LAP through a contact hole. For example, the second connection pattern CNP2 may be connected to the connection portion CP of the second upper active pattern UAP2 through a second-first contact hole CNT21 and be connected to the first area A1 of the lower active pattern LAP through a second-second contact hole CNT22. The second-first contact hole CNT21 may be formed by penetrating the fourth insulating layer IL4 and the fifth insulating layer IL5, and the second-second contact hole CNT22 may be formed by penetrating the first, second, third, fourth, and fifth insulating layers IL1, IL2, IL3, IL4, and IL5. Accordingly, the second initialization voltage applied to the second upper active pattern UAP2 may be transmitted to the first area A1 of the lower active pattern LAP through the second connection pattern CNP2 (see FIG. 21).

The third connection pattern CNP3 may connect the first upper active pattern UAP1 and the first connection pattern CNP1 through a contact hole. For example, the third connection pattern CNP3 may be connected to the first upper active pattern UAP1 through a second-third contact hole CNT23, and be connected to the first connection pattern CNP1 through a second-fourth contact hole CNT24.

The data connection pattern DCNP may be connected to the third area A3 of the lower active pattern LAP through a second-fifth contact hole CNT25. A data voltage (e.g., the data voltage VDATA of FIG. 2) may be applied to the data connection pattern DCNP. Accordingly, the data connection pattern DCNP may transmit the data voltage to the third area A3 of the lower active pattern LAP.

The fourth connection pattern CNP4 may extend in the first direction DR1. The fourth connection pattern CNP4 may connect the capacitor electrode CAE and the fourth area A4 of the lower active pattern LAP through a contact hole. For example, the fourth connection pattern CNP4 may be connected to the capacitor electrode CAE through a second-sixth contact hole CNT26, and be connected to the fourth area A4 of the lower active pattern LAP through a second-seventh contact hole CNT27. A first power voltage (e.g., the first power voltage ELVDD of FIG. 2) may be applied to the fourth connection pattern CNP4. Accordingly, the fourth connection pattern CNP4 may transmit the first power voltage to the capacitor electrode CAE and the fourth area A4 of the lower active pattern LAP.

The fifth connection pattern CNP5 may be connected to the fifth area A5 of the lower active pattern LAP through a second-eighth contact hole CNT28.

The second initialization voltage line ITL2 may extend in the first direction DR1. A second initialization voltage (e.g., the second initialization voltage VINT2 of FIG. 2) may be applied to the second initialization voltage line ITL2. The second initialization voltage line ITL2 may be connected to the lower active pattern LAP through a second-ninth contact hole CNT29. For example, the second initialization voltage line ITL2 may be connected to the sixth area A6 of the lower active pattern LAP through the second-ninth contact hole CNT29. Accordingly, the second initialization voltage line ITL2 may transmit the second initialization voltage to the lower active pattern LAP.

The sixth connection pattern CNP6 may be connected to the third upper active pattern UAP3 through a third-first contact hole CNT31.

The seventh connection pattern CNP7 may connect the seventh area A7 of the lower active pattern LAP and the bias voltage line BVL through a contact hole. For example, the seventh connection pattern CNP7 may be connected to the seventh area A7 of the lower active pattern LAP through a third-second contact hole CNT32 and be connected to the bias voltage line BVL through a third-third contact hole CNT33. Accordingly, the bias voltage applied to the bias voltage line BVL may be transmitted to the seventh area A7 of the lower active pattern LAP through the seventh connection pattern CNP7.

The first power voltage transmission line PTL1 may extend in the first direction DR1. A second power voltage (e.g., the second power voltage ELVSS of FIG. 2) may be applied to the first power voltage transmission line PTL1. The first power voltage transmission line PTL1 may transmit the second power voltage to a common electrode (e.g., the common electrode CE of FIG. 4).

For example, the first data conductive layer DAT1 may include metal, alloy, metal nitride, conductive metal oxide, transparent conductive material, and the like. These can be used alone or in combination with each other.

Figure 19:
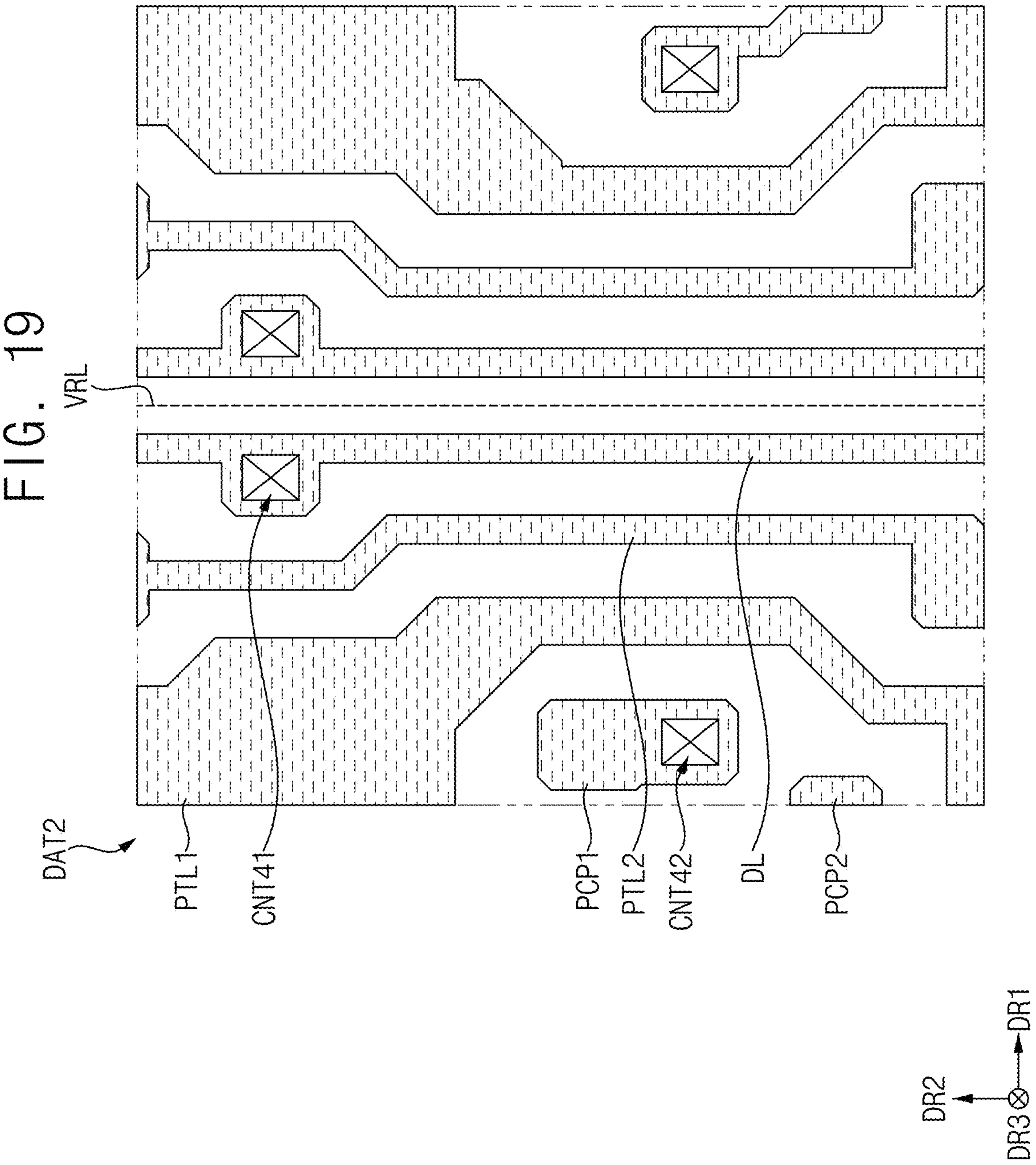

Referring further to FIG. 19, the circuit layer CL may further include a second data conductive layer DAT2 located on the first data conductive layer DAT1. For example, a sixth insulating layer IL6 may be located on the first data conductive layer DAT1, and the second data conductive layer DAT2 may be located on the sixth insulating layer IL6. For example, the sixth insulating layer IL6 may include an organic material such as phenol resin, acrylic resin, polyimide resin, polyamide resin, siloxane resin, epoxy resin, and the like. These can be used alone or in combination with each other (see FIGS. 20 and 21).

The second data conductive layer DAT2 may include a power voltage line PL, a second power voltage transmission line PTL2, a data line DL, a first anode connection pattern PCP1, and a second anode connection pattern PCP2.

The power voltage line PL, the second power voltage transmission line PTL2, the data line DL, the first anode connection pattern PCP1, and the second anode connection pattern PCP2 may be located in the same layer. In addition, the power voltage line PL, the second power voltage transmission line PTL2, the data line DL, the first anode connection pattern PCP1, and the second anode connection pattern PCP2 may include the same material and be formed through the same process.

The power voltage line PL may extend in the second direction DR2. A first power voltage (e.g., the first power voltage ELVDD of FIG. 2) may be applied to the power voltage line PL. According to some embodiments, the power supply voltage line PL may be connected to the fourth connection pattern CNP4. Accordingly, the power voltage line PL may transmit the first power voltage to the capacitor electrode CAE and the fourth area A4 of the lower active pattern LAP through the fourth connection pattern CNP4.

The data line DL may extend in the second direction DR2. A data voltage (e.g., the data voltage VDATA of FIG. 2) may be applied to the data line DL. The data line DL may be connected to the data connection pattern DCNP through a fourth-first contact hole CNT41. Accordingly, the data line DL may transmit the data voltage to the third area A3 of the lower active pattern LAP through the data connection pattern DCNP.

The second power voltage transmission line PTL2 may extend in the second direction DR2. The second power voltage transmission line PTL2 may be located between the power voltage line PL and the data line DL in the plan view. A second power voltage (e.g., the second power voltage ELVSS of FIG. 2) may be applied to the second power voltage line PTL2. The second power voltage transmission line PTL2 may transmit the second power voltage to a common electrode (e.g., the common electrode CE of FIG. 4).

The first anode connection pattern PCP1 may be connected to the fifth connection pattern CNP5 through a fourth-second contact hole CNT42. In addition, the first anode connection pattern PCP1 may be connected to a pixel electrode (e.g., the pixel electrode PE of FIG. 2) through a contact hole. In this case, the pixel electrode may be electrically connected to the lower active pattern LAP through the fifth connection pattern CNP5 and the first anode connection pattern PCP1. Accordingly, a light emitting element (e.g., the light emitting element LED of FIG. 2) and the pixel circuits PC1 and PC2 may be electrically connected through the first anode connection pattern PCP1.

The second anode connection pattern PCP2 may electrically connect a pixel circuit adjacent to the first pixel circuit PC1 in a direction opposite to the first direction DR1 and a pixel electrode located on the pixel circuit.

For example, the second data conductive layer DAT2 may include metal, alloy, metal nitride, conductive metal oxide, transparent conductive material, and the like. These can be used alone or in combination with each other.

A fifth insulating layer covering the second data conductive layer DAT2 may be further located on the fourth insulating layer IL4. The fifth insulating layer may include an organic material such as phenol resin, acrylic resin, polyimide resin, polyamide resin, siloxane resin, epoxy resin, and the like. These can be used alone or in combination with each other.

Referring again to FIGS. 10 and 16, the first transistor T1 may be referred to as a driving transistor, and each of the second, third, fourth, fifth, sixth, seventh, and eighth transistors T2, T3, T4, T5, T6, T7, and T8 may be referred to as a switching transistor.

Referring again to FIGS. 5, 6, 7, 8, 9, 10, 11, 12, 13, 14, 15, 16, 17, 18, 19, 20, and 21, in each pixel circuit PC1 and PC2 of the display device DD according to some embodiments of the present disclosure, the portion of the second upper active pattern UAP2 (e.g., a drain electrode) of the fourth transistor T4 may be connected to the first area A1 (e.g., drain electrode) of the first transistor T1 through the second connection pattern CNP2. In this case, for one frame, each pixel PX may perform the first initialization operation in which the first gate electrode GE1 of the first transistor T1 is initialized, and the second initialization operation in which the first area A1 of the first transistor T1 is initialized after the first initialization operation and immediately before the pixel PX emits light. That is, a charge accumulated in the first area A1 of the first transistor T1 may be bypassed by the bias voltage VOBS right immediately before the pixel PX emits light. Accordingly, the black voltage corresponding to the black gradation may be reduced. In addition, bright spot defects in the image due to current leakage of the fourth transistor T4 may be prevented or reduced.

Figure 22:
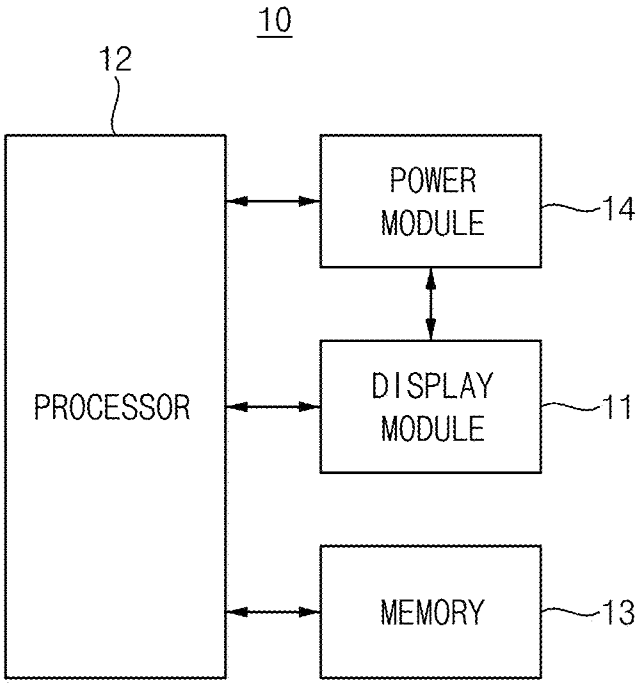
FIG. 22 is a block diagram showing an electronic device according to some embodiments of the present disclosure.

FIG. 22 is a block diagram showing an electronic device according to some embodiments of the present disclosure.

Referring to FIG. 22, an electronic device 10 may include a display module 11, a processor 12, a memory 13, and a power module 14.

A display device according to embodiments (e.g., the display device DD of FIG. 1) may be applied to various electronic devices 10. The electronic device 10 may include the display device described above, and may further include modules or devices with additional functions other than the display device.

The processor 12 may include at least one of a central processing unit (CPU), an application processor (AP), a graphic processing unit (GPU), a communication processor (CP), an image signal processor (ISP), and a controller.

The memory 15 may store data information necessary for the operation of the processor 12 or the display module 11. When the processor 12 executes the application stored in the memory 15, an image data signal (e.g. IDAT or ODAT of FIG. 1) and/or an input control signal (e.g., CTRL, DCTRL or GCTRL of FIG. 1) may be transmitted to the display module 11, and the display module 11 may process the received signal and output image information through a display screen.

The power module 14 may include a power supply module, such as a power adapter or a battery device, and a power conversion module which converts the power supplied by the power supply module to generate power required for the operation of the electronic device 10.

At least one of each component of the electronic device 10 described above may be included in the display device according to the above-described embodiments. In addition, some of the individual modules functionally included in one module may be included in the display device, and other portions may be provided separately from the display device. For example, the display device may include the display module 11, and the processor 12, the memory 13, and the power module 14 may be provided in the form of other devices within the electronic device 10 other than the display device. In other words, the processor 12 may be configured to the display device with the image data signal and the input control signal to control the display device.

FIG. 22 are schematic diagrams showing an electronic device according to some embodiments.

Figure 23:
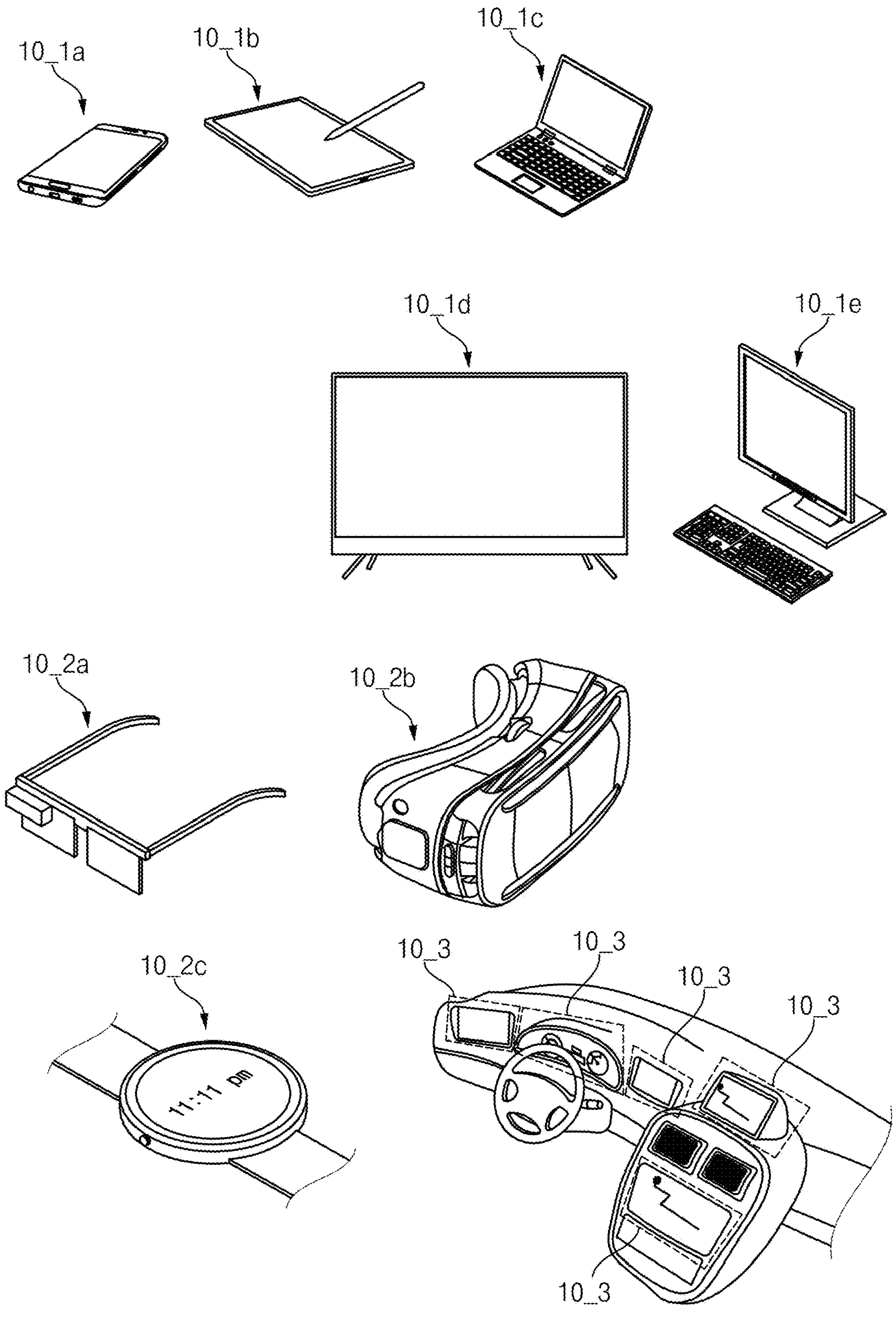
FIG. 23 are schematic diagrams showing an electronic device according to some embodiments of the present disclosure.

Referring to FIG. 23, various electronic devices 10 to which display devices according to the embodiments (e.g., the display device DD of FIG. 1) are applied may include not only image display electronic devices such as a smartphone 10_1*a*, a tablet PC 10_1*b*, a laptop 10_1*c*, a TV 10_1*d*, and a desktop monitor 10_1*e*, but also wearable electronic devices including display modules, such as smart glasses 10_2*a*, a head-mounted display 10_2*b*, and a smart watch 10_2*c*, automotive electronic devices 10_3 including display modules, such as a dashboard of a car, a center fascia, a Center Information Display (CID) disposed on a dashboard, and a room mirror display, or the like.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and characteristics of embodiments according to the present disclosure. Accordingly, all such modifications are intended to be included within the scope of the present inventive concept as defined in the appended claims, and their equivalents. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:

a pixel including: a pixel circuit and a light emitting element electrically connected to the pixel circuit and including an anode electrode and a cathode electrode;

a gate driver configured to output a gate signal to the pixel; and a data driver configured to output a data voltage to the pixel, wherein the pixel circuit includes:

a driving transistor including a first end of a first area, a second area electrically connected to a power voltage line configured to receive a driving voltage, a first channel area between the first area and the second area, and a portion of a first gate electrode overlapping the first channel area in a plan view;

a first switching transistor including a portion of a first upper active pattern on the first gate electrode and configured to receive an initialization voltage, and a portion of a first upper gate line configured to receive a first gate signal and overlapping the first upper active pattern in the plan view; and a connection pattern on the first upper gate line and connecting the first upper active pattern and the first area through a contact hole.

2. The display device of claim 1, wherein during one frame, an operation section of the pixel includes a first initialization section in which a first initialization operation is performed, a second initialization section in which a second initialization operation is performed after the first initialization operation, and a light emitting operation section in which a light emitting operation is performed after the second initialization operation.

3. The display device of claim 2, wherein the first initialization operation and the second initialization operation are controlled by a same first gate signal.

4. The display device of claim 2, wherein during one frame, the first gate signal has an activation level in the first initialization section and an activation level in the second initialization section.

5. The display device of claim 2, wherein the second initialization section is closer to a light emitting section than the first initialization section.

6. The display device of claim 2, wherein the pixel circuit further includes:

a second switching transistor including a second upper active pattern in a same layer as the first upper active pattern and a portion of a second upper gate line configured to receive a second gate signal different from the first gate signal and overlapping the second upper active pattern.

7. The display device of claim 6, wherein based on the first switching transistor being turned on and the second switching transistor being turned on in the first initialization section, the initialization voltage is applied to the first gate electrode of the driving transistor, and based on the first switching transistor being turned on in the second initialization section, the initialization voltage is applied to the first area of the driving transistor.

8. The display device of claim 6, wherein the second switching transistor further includes a portion of a second middle gate line configured to receive the second gate signal, located under the second upper gate line, and overlapping the second upper active pattern.

9. The display device of claim 6, wherein the driving transistor includes a silicon semiconductor, and the first and second switching transistors include a metal oxide semiconductor.

10. The display device of claim 6, wherein the pixel circuit further includes:

a third switching transistor including a second end of the first area, a third area electrically connected to the anode electrode, a second channel area between the first area and the third area, and a portion of a second gate electrode overlapping the second channel area in the plan view.

11. The display device of claim 1, wherein the first switching transistor further includes a portion of a first middle gate line configured to receive the first gate signal, located under the first upper gate line, and overlapping the first upper active pattern.

12. The display device of claim 1, wherein the first upper active pattern includes an extension portion extending in a first direction and a connection portion protruding from the extension portion in a second direction intersecting the first direction, and the first upper gate line partially overlaps the connection portion in the plan view.

13. The display device of claim 12, wherein the connection pattern is connected to the connection portion through a first contact hole and to the first area through a second contact hole.

14. The display device of claim 1, wherein the power voltage line is on the connection pattern.

15. An electronic device comprising:

a display device; and a processor configured to the display device with an image data signal and an input control signal to control the display device, wherein the display device includes:

a pixel including: a pixel circuit and a light emitting element electrically connected to the pixel circuit and including an anode electrode and a cathode electrode;

a gate driver configured to output a gate signal to the pixel; and a data driver configured to output a data voltage to the pixel, and wherein the pixel circuit includes:

a driving transistor including a first end of a first area, a second area electrically connected to a power voltage line configured to receive a driving voltage, a first channel area between the first area and the second area, and a portion of a first gate electrode overlapping the first channel area in a plan view;

a first switching transistor including a portion of a first upper active pattern on the first gate electrode and configured to receive an initialization voltage, and a portion of a first upper gate line configured to receive a first gate signal and overlapping the first upper active pattern in the plan view; and a connection pattern on the first upper gate line and connecting the first upper active pattern and the first area through a contact hole.

* * * * *